United States Patent
Takeya

(10) Patent No.: US 12,176,463 B2
(45) Date of Patent: Dec. 24, 2024

(54) SEMICONDUCTOR CHIP INTEGRATED DEVICE MANUFACTURING METHOD, SEMICONDUCTOR CHIP INTEGRATED DEVICE, SEMICONDUCTOR CHIP INTEGRATED DEVICE ASSEMBLY, SEMICONDUCTOR CHIP INK, AND SEMICONDUCTOR CHIP INK EJECTION DEVICE

(71) Applicant: ULDTEC CO., LTD., Miyagi (JP)

(72) Inventor: Motonobu Takeya, Miyagi (JP)

(73) Assignee: ULDTEC CO., LTD., Miyagi (JP)

( * ) Notice: Subject to any disclaimer, the term of this patent is extended or adjusted under 35 U.S.C. 154(b) by 323 days.

(21) Appl. No.: 17/616,813

(22) PCT Filed: Apr. 30, 2020

(86) PCT No.: PCT/JP2020/018221
§ 371 (c)(1),
(2) Date: Dec. 6, 2021

(87) PCT Pub. No.: WO2021/084783
PCT Pub. Date: May 6, 2021

(65) Prior Publication Data
US 2022/0310883 A1   Sep. 29, 2022

(30) Foreign Application Priority Data

Oct. 31, 2019 (JP) .................................. 2019-198092
Feb. 5, 2020 (JP) .................................. 2020-017576

(51) Int. Cl.
*H01L 33/40* (2010.01)
*H01L 21/66* (2006.01)
*H01L 25/075* (2006.01)
*H01L 33/00* (2010.01)
*H01L 33/62* (2010.01)

(52) U.S. Cl.
CPC .............. *H01L 33/40* (2013.01); *H01L 22/14* (2013.01); *H01L 22/22* (2013.01);
(Continued)

(58) Field of Classification Search
CPC .................................................... H01L 25/0753
See application file for complete search history.

(56) References Cited

U.S. PATENT DOCUMENTS

| 2011/0210352 A1 | 9/2011 | Lee et al. | |
| 2014/0267683 A1* | 9/2014 | Bibl ....................... | G09G 3/006 348/87 |

(Continued)

FOREIGN PATENT DOCUMENTS

| JP | 2001-237266 | 8/2001 |
| JP | 2003-216052 | 7/2003 |

(Continued)

OTHER PUBLICATIONS

International Search Report issued Jul. 7, 2020 in corresponding International Application No. PCT/JP2020/018221.

(Continued)

*Primary Examiner* — Erik Kielin
(74) *Attorney, Agent, or Firm* — K&L Gates LLP

(57) ABSTRACT

A liquid-droplet-like semiconductor chip ink 200 contains a liquid 50 and semiconductor chips 40, each of which has a first electrode and a second electrod on the upper surface and the lower surface and is configured such that the second electrode side is more strongly attracted to a magnetic field. The semiconductor chip ink 200 is supplied to a chip joining part on a lower electrode 420 which is formed on a mounting substrate 400, the second electrode side of the semiconductor chips 40 in the semiconductor chip ink 200 are attracted by a magnetic force by an external magnetic field so as to make contact with the chip joining part, and thereafter is (Continued)

electrically and mechanically joined to the chip joining part by using soldering and the like. Thereafter an upper electrode in which a plurality of branch line parts or a single branch line part are extended from a main line part so as to cover the chip joining part is formed, and the semiconductor chips 40 are connected between the lower electrode 420 and an upper electrode, whereby a semiconductor chip integrated device is manufactured.

9 Claims, 23 Drawing Sheets

(52) U.S. Cl.
CPC ........ *H01L 25/0753* (2013.01); *H01L 33/005* (2013.01); *H01L 33/62* (2013.01); *H01L 2933/0016* (2013.01); *H01L 2933/0066* (2013.01)

(56) References Cited

U.S. PATENT DOCUMENTS

| | | |
|---|---|---|
| 2016/0128159 A1 | 5/2016 | Usami |
| 2019/0013450 A1 | 1/2019 | Ploessl |
| 2019/0096858 A1* | 3/2019 | Woo .................... H01L 24/96 |
| 2019/0325790 A1 | 10/2019 | Park et al. |
| 2020/0395345 A1* | 12/2020 | Park .................... H01L 33/62 |
| 2021/0142716 A1* | 5/2021 | Robin ................ H01L 24/80 |
| 2024/0128418 A1* | 4/2024 | Tae .................... H01L 25/167 |

FOREIGN PATENT DOCUMENTS

| | | |
|---|---|---|
| JP | 2006-113258 | 4/2006 |
| JP | 2010-45145 | 2/2010 |
| JP | 2010-87453 | 4/2010 |
| JP | 2011-181925 | 9/2011 |
| JP | 2015-32483 | 2/2015 |
| JP | 2015-38957 | 2/2015 |
| JP | 2016-25205 | 2/2016 |
| JP | 2017-522720 | 8/2017 |
| JP | 2019-16794 | 1/2019 |
| JP | 2020-25064 | 2/2020 |
| JP | 6694222 | 5/2020 |
| WO | 2012/008253 | 1/2012 |

OTHER PUBLICATIONS

Written Opinion of the International Searching Authority issued Jul. 7, 2020 in International Application No. PCT/JP2020/018221.

* cited by examiner

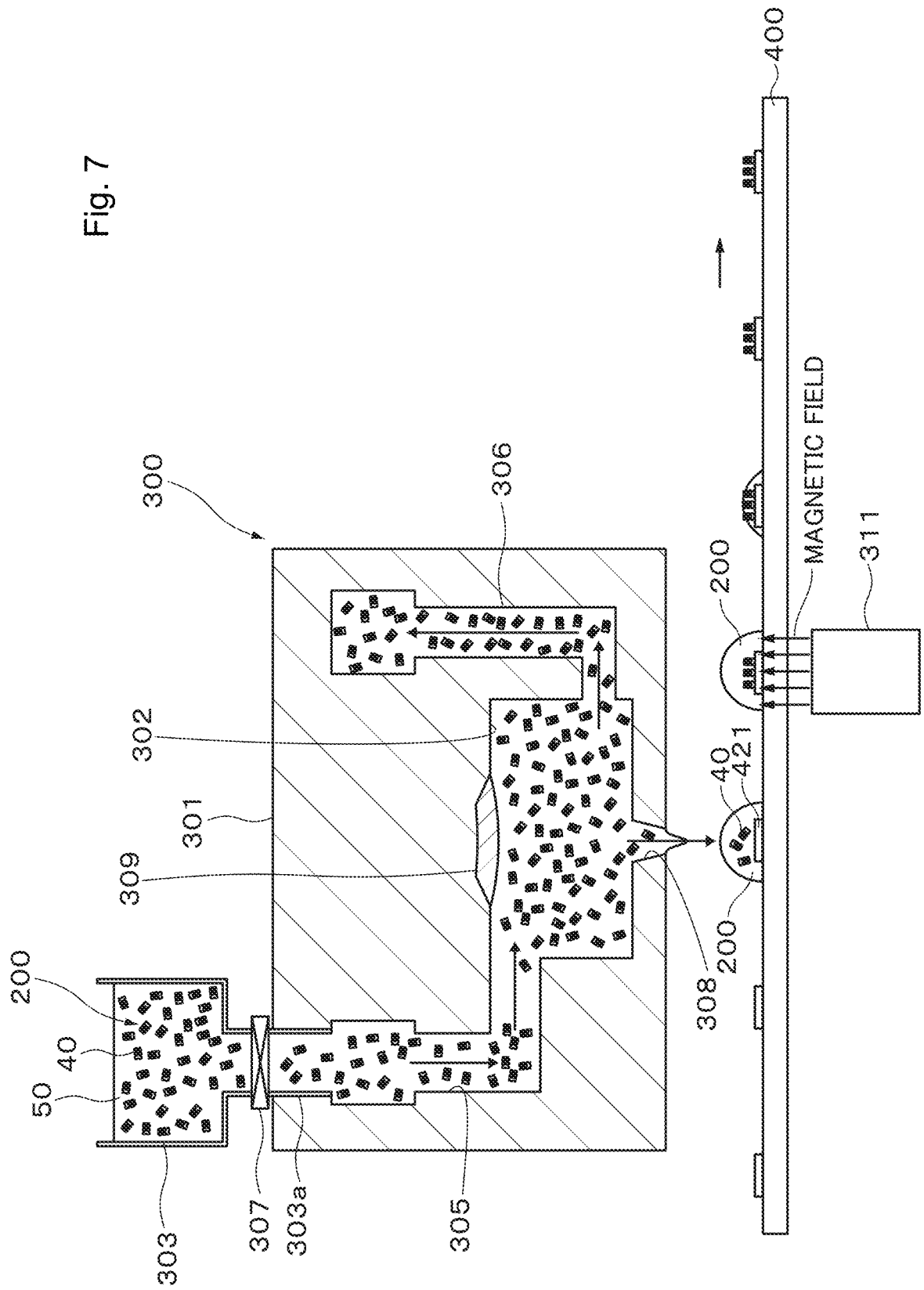

SEMICONDUCTOR CHIP INTEGRATED DEVICE MANUFACTURING METHOD, SEMICONDUCTOR CHIP INTEGRATED DEVICE, SEMICONDUCTOR CHIP INTEGRATED DEVICE ASSEMBLY, SEMICONDUCTOR CHIP INK, AND SEMICONDUCTOR CHIP INK EJECTION DEVICE

TECHNICAL FIELD

The present invention relates to a semiconductor chip integrated device manufacturing method, a semiconductor chip integrated device, a semiconductor chip integrated device assembly, a semiconductor chip ink, and a semiconductor chip ink ejection device which are suitably applied to, for example, a micro LED display in which a number of small-sized vertical (or longitudinal) GaN-based micro light emitting diode (LED) chips are integrated on a mounting substrate.

BACKGROUND ART

At present, the mainstream of displays such as thin type televisions, smartphones and the like are liquid crystal displays (LCDs) and organic EL displays (OLEDs). Regarding LCDs, the output light quantity is about one tenth of the light quantity of the backlight as pixels become small. Regarding OLEDs, although theoretical power efficiency is high, the output light quantity of real products remains in level equal to LCDs.

Micro LED displays receive attention as displays having high luminance high efficiency (low power assumption) far surpassing LCDs and OLEDs. Direct light emission micro LED displays have high efficiency. However, in order to realize micro LED displays, it is necessary to arrange several tens million micro LED chips having the size of order of several μm to tens of μm.

As methods for arranging such a large number of micro LED chips on a mounting substrate, proposed conventionally have been a method using a chip sorter, a method using a multichip transfer device (see patent literatures 1 and 2), a chip arranging method using chip ejection by laser irradiation and a liquid (see patent literature 3), a device (chip) arranging method using a magnetic film (see patent literatures 4 and 5) and the like.

Regarding the method using the chip sorter in which chips are moved from a position A to another position B, chips in A must be previously arranged to a certain extent. Therefore, when the chips are transferred, it takes time to confirm positions of the chips and the like. As a result, the transfer rate per chip is limited to 100~400 msec. In addition, the method generally uses a vacuum sucking type head, so that the minimum size of the chips which can be handled is ~100 μm □. Therefore, due to time necessary to manufacture and limitation of the size of chips which can be handled, the method is not suitable to manufacture the micro LED display in which chips having the size smaller than 100 μm □ are used and the number of pixels is several millions.

Regarding multichip transfer devices described in the patent literatures 1 and 2, since a large number of chips are transferred at a time, it is possible to manufacture the micro LED display faster than the chip sorter by several hundreds to several thousands. In this case, chips to be transferred must be arranged precisely. Therefore, sophisticated processing is given to a substrate so that chips can be separated from the substrate. However, special technology is necessary for the sophisticated processing, which leads to difficulties in lowering costs.

Regarding the chip arranging method described in the patent literature 3, there is disclosed a method in which chips are supplied to a pixel area by laser irradiation and the chips are joined to predetermined positions using a liquid. However, the chips must be arranged before laser irradiation. In addition to this, this method needs expensive laser irradiation devices and processing of the substrate (chip) to make possible chip ejection by laser irradiation, which lead to difficulties in lowering costs.

Regarding the device arranging method described in the patent literature 4, devices are arranged on the substrate by forming magnetic films on device arranging positions and the bottom of the device, scattering a number of devices over the substrate and adhering the magnetic film on the bottom of the device to the magnetic film on the device arranging positions by a magnetic force. The method is the technology which does not need arrangement of the devices, i.e. chips before transfer. However, the area occupied by the devices in the micro LED display is not larger than 1% (about 0.01%~0.1%) and therefore, the possibility that a randomly scattered device reaches the desired position is not larger than 1%. As a result, the random scattering needs a large number of chips. It is possible to increase the possibility of joining devices to the arranging positions by forming the thick magnetic film having the thickness of several μm and enlarging the area to which the effective magnetic field reaches. However, this invites increasing of manufacturing cost of the substrate.

Regarding the device arranging method described in the patent literature 5, device dispersed solution in which LED devices are dispersed in a solvent is prepared. In the LED device, a p-side electrode layer is formed on a p-type semiconductor layer, a ferromagnetic layer is formed thereon, an n-side electrode layer is formed on an n-type semiconductor layer, an antiferromagnetic layer is formed thereon and the ferromagnetic layer is magnetized by applying a magnetic field to obtain a saturation magnetization (spontaneous magnetization). A droplet of the device dispersed solution which contains an LED device is dropped on the substrate electrode of the mounting substrate. Magnetic field generating means is disposed on the back side of the mounting substrate. By applying a magnetic field to the LED device held over the substrate electrode by the magnetic field generating means, the saturation magnetized ferromagnetic layer is strongly attracted downward, the ferromagnetic layer is finally made contact with the substrate electrode, the solvent in the liquid droplet is evaporated and the LED device is soldered by heating the mounting substrate. However, the method suffers from the problem as the same as the patent literature 4.

PRIOR ART LITERATURE

Patent Literature

[PATENT LITERATURE 1] Laid-open publication No. 2017-531915
[PATENT LITERATURE 2] Laid-open publication No. 2017-500757
[PATENT LITERATURE 3] Laid-open publication No. 2005-174979
[PATENT LITERATURE 4] Laid-open publication No. 2003-216052
[PATENT LITERATURE 5] Laid-open publication No. 2016-25205

SUMMARY OF INVENTION

Subjects to be Solved by Invention

As described above, it has been difficult to realize micro LED displays at small cost.

Therefore, the subject to be solved by the invention is to provide a semiconductor chip integrated device manufacturing method which can manufacture various semiconductor chip integrated devices such as micro LED displays and the like, and such a semiconductor chip integrated device, a semiconductor chip integrated device assembly in which a plurality of semiconductor chip integrated devices are combined, a semiconductor chip ink and a semiconductor chip ink ejection device which are suitably used to manufacture the semiconductor chip integrated devices.

Means to Solve the Subjects

In order to solve the object, according to the invention, there is provided a semiconductor chip integrated device manufacturing method, comprising steps of:

supplying a liquid-droplet-like semiconductor chip ink containing a plurality of semiconductor chips, each of which has a first electrode and a second electrode on the upper surface and the lower surface and is configured such that the second electrode side is more strongly attracted to a magnetic field than the first electrode side and a liquid to a chip joining part formed on a lower electrode of a mounting substrate having the lower electrode on one major surface, drying the semiconductor chip ink, joining the semiconductor chips to the chip joining part in random arrangement such that the second electrode side faces the chip joining part and electrically connecting the second electrode and the lower electrode; and forming an upper electrode as the upper layer of the semiconductor chips having a main line part and a plurality of branch line parts or a single branch line part branched from the main line part.

Details of the semiconductor chip ink are described later. The semiconductor chip ink may not contain Zener diodes and/or a plurality of low melting point metal particles or may contain them. Methods for supplying the semiconductor chip ink to the chip joining part of the mounting substrate are not particularly limited and are selected as necessary. Morphology of the liquid-droplet-like semiconductor chip ink supplied to the chip joining part changes depending on wettability of the semiconductor chip ink for the chip joining part and may take various morphologies from ball-like liquid droplet with large curvature to a flat liquid droplet with small curvature. Typically, the semiconductor chip ink is ejected from the tip of a nozzle to the chip joining part. Preferably, the semiconductor chip ink is ejected from the tip of the nozzle to the chip joining part by an inkjet printing method. In this case, the quantity of the semiconductor chip ink ejected is selected as necessary as far as it contains a plurality of semiconductor chips per chip joining part (for example, 2~100). The semiconductor chip ink supplied to the chip joining part of the mounting substrate is subjected to compulsory drying by heating and the like or natural drying to remove liquid component. The semiconductor chips contained in the semiconductor chip ink supplied is made contact with the chip joining part with its second electrode side facing the chip joining part by a method which will be described later. The chip joining part is preferably made by flat surface (in other words, the chip joining part locates on the same surface as the periphery of the chip joining part) or a bump with flat surface projected from the periphery of the chip joining part. By forming the chip joining part as described above, it is easy to supply the liquid-droplet-like semiconductor chip ink to the chip joining part. In other words, the chip joining part is formed by a part of the upper surface or the bump formed on a part of the upper surface of the lower electrode. When the chip joining part is formed by a part of the upper surface of the lower electrode, the height of the part of the upper surface of the lower electrode forming the chip joining part is the same as that of the periphery of the chip joining part, or the part of the upper surface of the lower electrode forming the chip joining part is dented against the periphery of the chip joining part, that is, the chip joining part forms the concave part. The chip joining part seves as the part to which a plurality of semiconductor chips are joined.

The semiconductor chip has the first electrode and the second electrode on the upper surface and the lower surface, but may have additional one electrode or a plurality of electrodes. The chip joining part of the mounting substrate may contain or may not contain ferromagnetic materials. When the chip joining part contains ferromagnetic materials, the second electrode side is made contact with the chip joining part by a magnetic force with the second electrode side facing the chip joining part. On the other hand, when the chip joining part does not contain ferromagnetic materials, a liquid-droplet-like semiconductor chip ink is supplied to the chip joining part and thereafter an external magnetic field is applied from the back side of the mounting substrate so that the semiconductor chips in the semiconductor chip ink are joined to the chip joining part with the second electrode side facing the chip joining part. Electrical connection of the second electrode of the semiconductor chip and the lower electrode can be carried out, for example, by forming low melting point metal (for example, solder, low melting point metal particles and the like) and heating the low melting point metal to melt after the semiconductor chips are joined to the chip joining part with the second electrode side facing the chip joining part. In this way, the second electrodes of the semiconductor chips and the lower electrode are electrically and mechanically connected with each other.

In a typical example, the second electrode of the semiconductor chip contains ferromagnetic materials. For example, the second electrode is made of a layered film and at least one layer film forming the layered film is made of ferromagnetic materials. Ferromagnetic materials are not limited, but soft magnetic materials are suitably used. Here, the soft magnetic materials are materials having small coercive force and large permeability and is strongly magnetized under influence of a magnetic field and does not have a magnetic force when the magnetic field does not exist. The soft magnetic materials include, for example, nickel (Ni), iron (Fe), cobalt (Co), permalloy (Fe-78.5Ni alloy), supermalloy (Fe-79Ni-5Mo alloy), sendast (Fe-10Si-5Al alloy), Fe-4% Si alloy, SUS410L, permendule (Fe-50Co alloy), soft ferrite (50Mn-50Zn), amorphous magnetic alloy (Fe-8B-6C alloy) and the like, but not limited to these.

The semiconductor chip may be basically any and for example, chips of a light emitting device, a light receiving device, a transistor, an image sensor, a semiconductor solar battery, a semiconductor integrated circuit, a semiconductor sensor and the like. The light emitting device may include a light emitting diode (LED), a laser diode (LD) (especially, vertical cavity surface light emitting laser (VCSEL)), an organic EL device and the like. The light emitting device may be an AlGaInN-based semiconductor light emitting device, an AlGaInP-based semiconductor light emitting device and the like, but not limited to these. The AlGaInN-based semiconductor light emitting device is used to obtain light emission of a wavelength band of bluepurple, blue to green (wavelength of 390 nm~550 nm). The AlGaInP-based semiconductor light emitting device is used to obtain light emission of a wavelength band of red (wavelength of 600 nm~650 nm) is obtained. The light emitting device may be represented by a vertical (longitudinal) light emitting device having a p-side electrode and an n-side electrode as the first electrode and the second electrode in the vertical direction sandwiching the light emitting layer. In a typical example, the semiconductor chip is a light emitting device chip which has a p-side electrode and an n-side electrode on the upper surface and the lower surface and is configured such that one of the p-side electrode side and the n-side electrode side is more strongly attracted to a magnetic field than the other. The light receiving device is typically a photodiode and its materials are silicon, compound semiconductor and the like, but not limited to these. The transistor may be basically any and for example, a vertical MOSFET (a thin film transistor is included), a back gate MOSFET (a thin film transistor is included), a vertical bipolar transistor, an insulated gate bipolar transistor (IGBT), a static induction transistor (SIT) and the like. The image sensor is, for example, a CCD image sensor, a MOS image sensor and the like, but not limited to these. The semiconductor solar battery typically uses silicon, compound semiconductor and the like, but not limited to these. The semiconductor integrated circuit is IC, LSI, VLSI, VLSI and the like and uses silicon, compound semiconductor and the like, but not limited to these. In this case, for example, a back metal formed on the back surface of the semiconductor chip can be used as the first electrode or the second electrode. Regarding the semiconductor sensor, its materials and the like are selected depending on an object to be sensed and for example, silicon, compound semiconductor and the like.

Chip size of the semiconductor chip is selected as necessary and is generally selected to be not larger than 20 μm×20 μm or 10 μm×10 μm and is generally selected to be not smaller than 0.1 μm (100 nm)×0.1 μm (100 nm) or 0.5 μm (500 nm)×0.5 μm (500 nm). The thickness of the semiconductor chip is selected as necessary and is generally selected to be not larger than 10 μm, preferably 5 μm. Especially, when the semiconductor chip is a light emitting device chip, the light emitting device chip is desired to be one produced by carrying out crystal growth of semiconductor layers forming the light emitting device on a substrate and separating the substrate from the semiconductor layers and its thickness is desired to be not larger than 10 μm, for example. The semiconductor chip has, preferably, rotation symmetry with respect to an axis vertical to the chip surface and its shape is, for example, a circle, a square, a hexagon, an octagon and the like. In this case, the shape of the semiconductor chip is a cylinder, a square prism, a hexagonal prism, an octagonal prism and the like, but not limited to these. The semiconductor chip may be a truncated cone (obtained by cutting the top portion of a cone), a truncated polygonal cone (obtained by cutting the top portion of a polygonal cone) and the like. Especially, when the semiconductor chip has a cylinder shape, the semiconductor chip has preferably a diameter not larger than 10 μm and a thickness not larger than 10 μm.

The mounting substrate is not limited and may be, for example, a Si substrate, a glass substrate, a glass epoxy substrate, a resin film, a printed circuit board and the like. A plurality of chip joining parts are formed on the lower electrode formed on one major surface of the mounting substrate. Arranging patterns, sizes, planar shapes, intervals and the like of chip joining parts are selected as necessary depending on uses of the semiconductor chip integrated device, semiconductor chips to be mounted and the like. In an example of arranging pattern of chip joining parts of the mounting substrate, the chip joining parts are formed in a two-dimensional array. In this case, a plurality of semiconductor chips are joined to the respective chip joining parts formed in a two-dimensional array. The lower electrode serves as a wiring line for connecting the semiconductor chips joined to the chip joining parts. The lower electrodes are formed in a desired pattern, arrangement and intervals. Size and the planar shape of the chip joining part are selected properly depending on the size and the planar shape of the semiconductor chip to be mounted so that the semiconductor chips are joined to the chip joining part. Intervals, numbers and the like of the chip joining parts are selected properly depending on functions demanded for the semiconductor chip integrated device. When the chip joining part contains ferromagnetic materials, $S \leq 1000s$ generally holds assuming that S denotes the area of the chip joining part and s denotes the area of the semiconductor chip. When the chip joining part does not contain ferromagnetic materials, $10s \leq S \leq 1000s$ generally holds. Here, when the chip joining part does not contain ferromagnetic materials, it is necessary to obtain the area where the semiconductor chips can be joined to some extent for extent of the semiconductor chip ink. As a result, $10s \leq S$ is adopted. On the other hand, if S is too much large, it may be an obstacle to device design such as wiring and the like. Therefore, $S \leq 1000s$ is appropriate. Structure of the chip joining part is selected as necessary. For example, the chip joining part is made of a layered film and at least one layer of the layered film is made of ferromagnetic materials. When the chip joining part contains ferromagnetic materials, the ferromagnetic materials are not limited and are preferably hard magnetic materials with a large coercive force. The hard magnetic materials have properties that after the magnetic field is removed, it has the coercive force, which are used as permanent magnet. The hard magnetic materials are, for example, neodymium iron boron (Nd—Fe—B) magnet, cobalt platinum (Co—Pt)-based magnet (Co—Pt magnet, Co—Cr—Pt magnet and the like), samarium cobalt (Sm—Co) magnet, samarium iron nitrogen (Sm—Fe—N) magnet, ferrite magnet, alnico magnet and the like, but not limited to these. The hard magnetic materials may be materials having ferrimagnetic property such as magnetite (Fe3O4) and the like. The ferromagnetic materials, especially hard magnetic materials contained in the chip joining part may be composite in which their powders are mixed with resin. Orientation of the magnetization of the ferromagnetic materials forming the chip joining part is not limited and may be any. The orientation of the magnetization is, for example, vertical to one major surface of the mounting substrate.

The upper electrode formed as the upper layer of the semiconductor chips has a plurality of branch line parts or a single branch line part so as to straddle the chip joining part, preferably to extend over almost all the area of the chip joining part. The branch line parts or the single branch line part may typically cover more than 80% of the area of the chip joining part. When the upper electrode has the branch line part, the width of each branch line part is 5~100 μm, the width of an opening between the branch line parts is 1~5 μm and the number of the branch line parts is 3~10. These numerals can be designed suitably depending on sizes of a cicuit unit or a pixel containing the semiconductor chips joined to the chip joining part, the area or shape of the chip joining part, chip size and the like. Typically, the branch line parts or the single branch line part may be formed perpendicular to the main line part and the branch line parts are formed parallel to each other, but not limited to this. Each of the branch line parts or the single branch line part may be generally connected to each first electrode of at least one, typically more than two of the semiconductor chips joined to the chip joining part in random arrangement. Regarding the branch line parts, there may be a case where the branch line parts include branch line parts which are not electrically connected to the first electrode of every semiconductor chip. The main line part is typically formed to extend along the chip joining parts. After the upper electrode is formed, typically, a test of the semiconductor chips is carried out and at least a part of the branch line part to which inferior semiconductor chips are connected is cut off to separate the inferior semiconductor chips.

At least one semiconductor chip, for example, a plurality of semiconductor chips may be connected between the lower electrode and the branch line part of the upper electrode such that the second electrodes are connected with the lower electrode and the first electrodes are connected with the branch line part. As necessary, one or a plurality of Zener diodes may be connected between the lower electrode and the branch line part of the upper electrode such that reverse bias is applied to the Zener diodes. The Zener diode has a pn junction made of a p-type layer and an n-type layer and has a p-side electrode and an n-side electrode on the upper surface and the lower surface and is configured such that one of the p-side electrode side or the n-side electrode side is more strongly attracted to a magnetic field than the other. Since the Zener diodes are connected between the lower electrode and the branch line part of the upper electrode such that reverse bias is applied to the Zener diodes as described above, if a surge voltage and the like is applied between the lower electrode and the upper electrode for some reason, current can pass through the Zener diodes. Therefore, it is possible to prevent electrostatic damage (ESD damage) of the semiconductor chip. In a typical example, the semiconductor chip is a light emitting device chip which has a p-side electrode and an n-side electrode on the upper surface and the lower surface (here the p-side electrode and the n-side electrode correspond to the second electrode and the first electrode, respectively, or the n-side electrode and the p-side electrode correspond to the second electrode and the first electrode, respectively) and is configured such that one of the p-side electrode side or the n-side electrode side is more strongly attracted to a magnetic field than the other. The light emitting device chip is forwardly connected and the Zener diodes are connected such that they are reversely biased for the light emitting device chip. Or, the semiconductor chips include a first light emitting device chips, each of which has a p-side electrode and an n-side electrode on the upper surface and the lower surface and is configured such that one of the p-side electrode side and the n-side electrode side is more strongly attracted to a magnetic field than the other and a second light emitting device chips, each of which has a p-side electrode and an n-side electrode on the upper surface and the lower surface and is configured such that one of the p-side electrode side and the n-side electrode side, which is opposite to the one of the first light emitting device chips, is more strongly attracted to a magnetic field than the other, and the first light emitting device chips are forwardly connected and the second light emitting device chips are connected such that they are reversely biased for the first light emitting device chips. In this case, the second light emitting device chip serves as the Zener diode.

The semiconductor chip integrated device may be any and is suitably designed depending on kinds of semiconductor chips. The semiconductor chip integrated device may be a device in which a kind of semiconductor chip is integrated or the device in which more than two kinds of semiconductor chips are integrated. When the semiconductor chip is a light emitting device chip, the light emitting diode chip integrated device is, for example, a light emitting diode illumination device, a light emitting diode backlight, a light emitting diode display and the like, but not limited to these. Size, planar shape and the like of the semiconductor chip integrated device are suitably selected depending on uses of the semiconductor chip integrated device, functions demanded for the semiconductor chip integrated device and the like.

According to the invention, there is provided a semiconductor chip integrated device, comprising:
  a mounting substrate having a lower electrode on one major surface,
  a chip joining part formed on the lower electrode,
  a plurality of semiconductor chips joined to the chip joining part in random arrangement, each of which has a first electrode and a second electrode on the upper surface and the lower surface and is configured such that the second electrode side is more strongly attracted to a magnetic field than the first electrode side; and
  an upper electrode as the upper layer of the semiconductor chips having a main line part and a plurality of branch line parts or a single branch line part branched from the main line part,
  the semiconductor chips being joined to the chip joining part such that the second electrode side faces the chip joining part, the second electrode and the upper electrode being electrically connected with each other, and the first electrode of at least one semiconductor chip and the branch line parts or the single branch line part being electrically connected with each other.

In the invention of the semiconductor chip integrated device, the explanation concerning the above invention of the semiconductor chip integrated device manufacturing method comes into effect unless it is contrary to its character.

According to the invention, there is provided a semiconductor chip ink, comprising:
  a plurality of semiconductor chips, each of which has a first electrode and a second electrode on the upper surface and the lower surface and is configured such that the second electrode side is more strongly attracted to a magnetic field than the first electrode side,
  at least one of a plurality of Zener diodes, each of which has a p-side electrode and an n-side electrode on the upper surface and the lower surface and is configured such that one of the p-side electrode side and the n-side electrode side is more strongly attracted to a magnetic field than the other and a plurality of low melting point metal particles; and
  a liquid.

Regarding the semiconductor chips contained in the semiconductor chip ink, the explanation concerning the invention of the semiconductor chip integrated device manufacturing method comes into effect. The liquid contained in the semiconductor chip ink is not particularly limited as far as semiconductor chips to be used can be dipersed, and may be polar solvent or nonpolar solvent and selected as necessary. Polar solvent may be polar nonprotonic solvent and protonic solvent. The liquid may be water or nonaqueous solvent (a mixture of two or more kinds of solvents other than water and a mixture of water and two or more kinds of solvents other than water are included) and nonaqueous solvent may be nonactive solvent or active solvent. Nonactive solvent is, for example, benzene, toluene, hexane, carbon tetrachloride, acetonitrile and the like. Active solvent may be amphoteric solvent, acidic solvent or basic solvent. Here, amphoteric solvent is preferred. Amphoteric solvent is, for example, methanol, ethanol, formaldehyde, acetamide and the like.

When the semiconductor chip ink contains a plurality of Zener diodes, by connecting the Zener diodes between the lower electrode and the upper electrode such that reverse bias is applied to the Zener diodes, it is possible to prevent electrostatic damage (ESD damage) of the semiconductor chips. When the semiconductor chip ink contains a plurality of low melting point metal particles, even though low melting point metal is not formed on the chip joining part before the second electrode side of the semiconductor chips are joined to the chip joining part, it is possible to attach not only the semiconductor chips but also low melting point metal particles to the chip joining part when the semiconductor chip ink is supplied to the chip joining part. Therefore, it is not necessary to form low melting point metal, which simplifies manufacturing steps. As necessary, the semiconductor chip ink may contain other components in addition to the semiconductor chips, one of the Zener diodes and the low melting point metal particles and the liquid. The other components are, for example, fillers, surfactants and the like. Materials, shapes, sizes and the like of the fillers are not particularly limited as far as they can be dispersed in the liquid of the semiconductor chip ink and selected as necessary. For example, materials of the fillers are various resins such as silicone resin and the like. Shapes of the fillers are a sphere, an ellipsoid and the like. Sizes of the fillers are selected depending on size of the semiconductor chip and the like and the average diameter of the filler is about 1~10 μm. Various advantages can be obtained by containing the fillers in the semiconductor chip ink. That is, it is possible to disperse the semiconductor chips in the liquid easily and uniformly and easily keep the uniform dispersion state. Furthermore, by adjusting the concentration of the fillers and the semiconductor chips per unit volume of the semiconductor chip ink, it become easy to adjust the number of the semiconductor chips in a liquid-dropplet when the semiconductor chip ink is supplied one time by ejection using a nozzle and the like. The fillers also serve as buffer materials for preventing the semiconductor chips from damage due to collision among themselves in the semiconductor chip ink. Furthermore, since the fillers also serve as lubricant materials, it is possible to prevent choking of an ejection opening of the nozzle when the semiconductor chip ink is supplied by using, for example, an inkjet printing method. The surfactants can disperse the semiconductor chips in the liquid easily and uniformly and keep uniform dispersion state. The surfactants are not limited and selected as necessary. The surfactants may be any of, for example, anion surfactants such as for example, $C_{17}H_{35}COONa$ and the like, cation surfactants such as for example, $C_{12}H_{25}N(CH_3)_3Cl$ and the like, amphoteric surfactants such as for example, $C_{12}H_{25}NHCH_2CH_2SO_3Na$ and the like and nonion surfactants such as, for example, $C_9H_{19}(C_6H_4)(OCH_2CH_2)_6OH$ and the like. The semiconductor chip ink may contain semiconductor chips serving as Zener diodes instead of a plurality of Zener diodes. More specifically, as described above in conjunction with the semiconductor chip integrated device manufacturing method, the semiconductor chip may contain the first light emitting device chips, each of which has a p-side electrode and an n-side electrode on the upper surface and the lower surface and is configured such that one of the p-side electrode side and the n-side electrode side is more strongly attracted to a magnetic field than the other and the second light emitting device chips, each of which has a p-side electrode and an n-side electrode on the upper surface and the lower surface and is configured such that one of the p-side electrode side and the n-side electrode side, which is the opposite side of the first light emitting device chip, is more strongly attracted to a magnetic field. In this case, the first light emitting device chips are used as real emitting devices and the second light emitting device chips serve as Zener diodes.

The concentration of the semiconductor chips in the semiconductor chip ink is selected as necessary. Typically, 10~10000 semiconductor chips are dispersed in the volume of 100 picoliters of the liquid. The volume ratio of the semiconductor chips in the semiconductor chip ink is selected as necessary and is typically not larger than 30%. The viscosity of the semiconductor chip ink is selected as necessary and is, for example, 0.001~100 Pa·s.

According to the invention, there is provided a semiconductor chip ink ejection device, comprising:
at least one ink chamber for storing a semiconductor chip ink comprising: a plurality of semiconductor chips, each of which has a first electrode and a second electrode on the upper surface and the lower surface and is configured such that the second electrode side is more strongly attracted to a magnetic field than the first electrode side, at least one of a plurality of Zener diodes, each of which has a p-side electrode and an n-side electrode on the upper surface and the lower surface and is configured such that one of the p-side electrode side and the n-side electrode side is more strongly attracted to a magnetic field than the other and a plurality of low melting point metal particles; and a liquid,
an ejection nozzle which is provided in the ink chamber; and
an ejection mechanism for ejecting the semiconductor chip ink from the ejection nozzle which is provided in the ink chamber.

The ejection mechanism is not particularly limited and selected as necessary. The ejection mechanism is of, for example, a type of ejecting the semiconductor chip ink by its pressure increase by a piezoactuator or an electrostatic actuator, a type of using the volume expansion of the semiconductor chip ink by vaporizing the liquid of the semiconductor chip ink by heating and the like. The number of the ink chambers may be one or more than two, which is selected as necessary. In a preferred example, the semiconductor chip ink ejection device further comprises a semiconductor chip ink supplying part for supplying the semiconductor chip ink to the ink chamber, a supplying path which connects the semiconductor chip ink supplying part and the ink chamber and a control valve provided in the supplying path. Typically, the semiconductor chip ink ejection device is an inkjet print head, but not limited to this. When the semiconductor chip ink ejection device ejects the semiconductor chip ink to the chip joining part of the mounting substrate having a plurality of chip joining parts on one major surface and the semiconductor chip has the first electrode and the second electrode and is configured such that the second electrode side is more strongly attracted to a magnetic field than the first electrode side and the chip joining part of the mounting substrate does not contain ferromagnetic materials, the semiconductor chip ink ejection device further comprises an external magnetic field applying mechanism for applying the external magnetic field to the chip joining part. In this case, by applying the external magnetic field, it is possible to make contact the semiconductor chips in the semiconductor chip ink with the chip joining part, the second electrode side facing the chip joining part. Timing of application of the external magnetic field may be any of before ejection of the semiconductor chip ink, at the same time of ejection of the semiconductor chip ink, just after ejection of the semiconductor chip ink and selected as necessary.

In the invention of the semiconductor chip ink ejection device, other than the above, the explanation concerning the above inventions of the semiconductor chip integrated device manufacturing method and the semiconductor chip ink comes into effect unless it is contrary to its character.

According to the invention, there is provided a semiconductor chip integrated device manufacturing method, comprising steps of:

supplying a liquid-droplet-like semiconductor chip ink containing a plurality of semiconductor chips, each of which has a first electrode and a second electrode on the upper surface and the lower surface and is configured such that the second electrode side is more strongly attracted to a magnetic field than the first electrode side to a chip joining part formed on a lower electrode formed on a mounting substrate having the lower electrode on one major surface and a plurality of side face electrodes elongating between the upper surface and the lower surface on side faces thereof and being configured such that a wiring line part of the lower electrode and at least one side face electrode are electrically connected with each other, drying the semiconductor chip ink, connecting the semiconductor chips to the chip joining part in random arrangement such that the second electrode side faces the chip joining part and electrically connecting the second electrode and the lower electrode with each other; and forming an upper electrode as the upper layer of the semiconductor chips having a main line part and a single branch line part or a plurality of branch line parts branched from the main line part such that the first electrode of at least one semiconductor chip and the branch line part of the upper electrode are electrically connected with each other and at least one side face electrode other than the side face electrodes which are connected with the wiring line part of the lower electrode and the main line part are electrically connected with each other.

According to the invention, there is provided a semiconductor chip integrated device, comprising:

a mounting substrate having a lower electrode on one major surface and a plurality of side face electrodes elongating between the upper surface and the lower surface on side faces thereof and is configured such that a wiring line part of the lower electrode and at least one side face electrode are electrically connected with each other, a chip joining part formed on the lower electrode, a plurality of semiconductor chips, each of which has a first electrode and a second electrode on the upper surface and the lower surface and is configured such that the second electrode side is more strongly attracted to a magnetic field than the first electrode side, which are joined in random arrangement to the chip joining part; and an upper electrode as the upper layer of the semiconductor chips having a main line part and a single branch line part or a plurality of branch line parts branched from the main line part and being configured such that one side face electrode other than the side face electrodes which are connected with the wiring line part of the lower electrode and the main line part are electrically connected with each other, the semiconductor chips being joined to the chip joining part such that the second electrode side faces the chip joining part, the second electrode and the lower electrode being electrically connected with each other, and the first electrode of at least one semiconductor chip and the single branch line part or the branch line parts being electrically connected with each other.

In the invention of the semiconductor chip integrated device, the explanation concerning the above invention of the semiconductor chip integrated device manufacturing method comes into effect unless it is contrary to its character.

By mounting a plurality of semiconductor chip integrated devices on one major surface of a circuit board adjacent to each other or connected with each other, it is possible to easily realize a semiconductor chip integrated device assembly. In the semiconductor chip integrated device assembly, the side face electrodes of the mounting substrate of the semiconductor chip integrated device are electrically connected with through-hole electrodes formed in the circuit board and the through-hole electrodes are electrically connected with circuits formed on the other major surface of the circuit board. For example, when the semiconductor chip integrated device is a light emitting diode display, it is possible to easily realize a large area light emitting diode display in which a plurality of light emitting diode displays are arranged by the semiconductor chip integrated device assembly. When the semiconductor chip integrated device is a light emitting diode illumination device or a light emitting diode backlight, it is possible to easily realize a large area light emitting diode illumination device or a light emitting diode backlight in which a plurality of light emitting diode illumination devices or light emitting diode backlights are arranged by the semiconductor chip integrated device assembly.

According to the invention, there is provided a semiconductor chip integrated device manufacturing method, comprising a step of:

supplying a liquid-droplet-like semiconductor chip ink containing one or a plurality of semiconductor chips, each of which has a first electrode and a second electrode on the upper surface and the lower surface and is configured such that the second electrode side is more strongly attracted to a magnetic field than the first electrode side and a liquid to a chip joining part of a mounting substrate having a plurality of chip joining parts on one major surface.

In the invention of the semiconductor chip integrated device manufacturing method, the explanation concerning the above invention of the semiconductor chip integrated device manufacturing method comes into effect unless it is contrary to its character.

According to the invention, there is provided a semiconductor chip integrated device, comprising:

a mounting substrate having a chip joining part containing ferromagnetic materials or a chip joining part not containing ferromagnetic materials on one major surface, the chip joining part being made of flat surface or a bump having a flat upper surface for the periphery of the chip joining part, a semiconductor chip which has a first electrode and a second electrode and is configured such that the second electrode side is more strongly attracted to a magnetic field than the first electrode side being joined to the chip joining part by a magnetic force, adhesion force by adhesion materials, plating or fusion by low melting point metal such that the the second electrode side faces the chip joining part.

In the invention of the semiconductor chip integrated device, the explanation concerning the above invention of the semiconductor chip integrated device comes into effect unless it is contrary to its character.

Effect of the Invention

According to the invention, it is possible to easily make contact the semiconductor chips with the chip joining part of the mounting substrate such that the second electrode side faces the chip joining part by supplying the semiconductor chip ink to the chip joining part of the mounting substrate and by a magnetic force applied between the chip joining part and the second electrode side when the chip joining part contains ferromagnetic materials and by applying an external magnetic field from the back side of mounting substrate when the chip joining part does not contain ferromagnetic materials. And, for example, by forming low melting point metal on the chip joining part or the second electrode, making contact the semiconductor chips with the chip joining part such that the second electrode side faces downward and by heating the low melting metal to make melt, it is possible to connect electrically and mechanically the semiconductor chips and the chip joining part. And, for example, by forming the chip joining parts in a two-dimensional array, it is possible to easily realize a large-sized or large integration density semiconductor chip integrated device, for example, a light emiting diode illumination device, a large-sized light emiting diode backlight, a large screen light emiting diode display, a power control device, an integrated sensor and the like. Furthermore, when the test of the semiconductor chips are carried out after the upper electrode is formed and inferior semiconductor chips are found, it is possible to easily repair by removing a connection part of the inferior semiconductor chips of the branch line part of the upper electrode to which the inferior semiconductor chips are connected by laser ablation and the like to separate it, which can realize simplification of repair work and increase of the yield of the product. According to the method, for example, in the case of a light emitting diode display and the like, by decreasing extremely the size of the semiconductor chip and arranging a plurality of semiconductor chips in a pixel, when inferior semiconductor chips are included in the pixel, the inferior semiconductor chips can be separated from the branch line part. Therefore, remaining semiconductor chips connected to the branch line part can be used. As a result, it is possible to reduce loss of materials (semiconductor chips) and control increase of cost of materials caused by introduction of repair structure. Furthermore, by using the mounting sustrate having the lower electrode on one major surface and a plurality of side face electrodes on the side face elongating between the upper surface and the lower surface, the wiring line part of the lower electrode and at least one side face electrode being electrically connected with each other, for example, it is possible to easily realize a semiconductor chip integrated device assembly in which a plurality of semiconductor chip integrated devices are adjacently mounted on one major surface of a circuit board. Therefore, for example, when the semiconductor chip integrated device is a light emitting diode display, a plurality of light emitting diode displays can be connected without remarkable panel junctions. As a result, a large-sized excellent light emitting diode display panel can be easily realized.

Furthermore, according to the invention, it is possible to easily make contact the semiconductor chips with the chip joining part of the mounting substrate such that the second electrode side faces the chip joining part by supplying the semiconductor chip ink to the chip joining part of the mounting substrate and by a magnetic force applied between the chip joining part and the second electrode side when the chip joining part contains ferromagnetic materials and by applying an external magnetic field when the chip joining part does not contain ferromagnetic materials. And, for example, by forming adhesional materials or low melting point metal on the chip joining part and making contact the second electrode side with the adhesional materials on the chip joining part to fix and then carrying out plating, or making contact the second electrode side with the low melting point metal on the chip joining part and then heating the low melting metal to make melt, it is possible to join electrically and mechanically the semiconductor chips and the chip joining part. And, for example, by forming the chip joining parts in a two-dimensional array, it is possible to easily realize a large-sized or large integration density semiconductor chip integrated device, for example, a light emiting diode illumination device, a large-sized light emitting diode backlight, a large screen light emitting diode display, a power control device, an integrated sensor and the like.

BRIEF DESCRIPTION OF THE DRAWINGS

FIG. 7 A schematic view showing a semiconductor chip ink ejection device which is used in the micro LED integrated device manufacturing method according to the first embodiment of the invention.

MODES FOR CARRYING OUT THE INVENTION

Modes for carrying out the invention (hereinafter referred as embodiments) will now be explained below.

The First Embodiment

The micro LED integrated device according to the first embodiment is manufactured by mounting a number of vertical micro LED chips on a mounting substrate. Firstly, the vertical micro LED chip having a p-side electrode and an n-side electrode on the upper surface and the lower suface, a semiconductor chip ink containing the vertical micro LED chips, and a semiconductor chip ink ejection device which is used to eject the semiconductor chip ink and the mounting substrate are described.

Micro LED Integrated Device Manufacturing Method (1) Vertical Micro LED Chip A method for manufacturing the vertical micro LED chip is described. The vertical micro LED chip is configured such that the p-side electrode side is more strongly attracted to a magnetic field than the n-side electrode side.

Figure 1A:
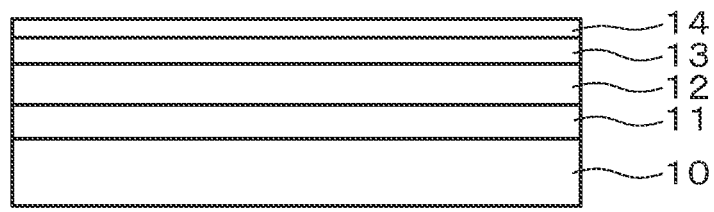
FIG. 1A A cross-sectional view showing a method for manufacturing a vertical micro LED chip which is used in the micro LED integrated device manufacturing method according to a first embodiment of the invention.

As shown in FIG. 1A, epitaxially grown on a sapphire substrate 10 in order are an n-type GaN layer 11, an n$^+$-type GaN layer 12, a light emitting layer 13 having InxGa1-xN/InyGa1-yN multiquantum well (MQW) structure (x<y, 0≤x<1, 0≤y<1) in which the InxGa1-xN layer as the barrier layer and the InyGa1-yN layer as the well layer are alternately formed and a p-type GaN layer 14. The thickness of the n-type GaN layer 11 is, for example, 0.5~1 μm. The thickness of the n$^+$-type GaN layer 12 is, for example, 0.8~2.6 μm. The thickness of the light emitting layer 13 is, for example, 0.1~0.2 μm. The thickness of the p-type GaN layer 14 is, for example, 0.1~0.2 μm. The total thickness of the n$^+$-type GaN layer 12, the light emitting layer 13 and the p-type GaN layer 14 is, for example, 1~3 μm.

Figure 1B:
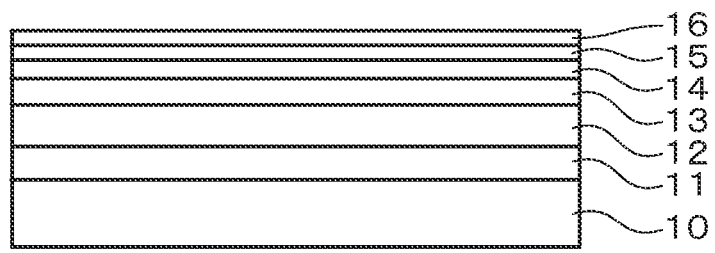
FIG. 1B A cross-sectional view showing the method for manufacturing the vertical micro LED chip which is used in the micro LED integrated device manufacturing method according to the first embodiment of the invention.

Then, as shown in FIG. 1B, a metal film 15 for forming p-side electrodes and a Sn film 16 as low melting point metal are formed in order on the whole surface of the the the p-type GaN layer 14 by for example, a vacuum evaporation method. As the metal film 15, for example, used is a multilayered film such as a Ti/Ni/Ti/Ni/Ti/Ni/Ti/Au film and the like. The thickness of each film forming the metal film 15 is, for example, Ti film 0.01 μm, Ni film 0.2 μm, Ti film 0.1 μm, Ni film 0.2 μm, Ti film 0.1 μm, Ni film 0.2 μm, Ti film 0.1 μm, Au film 0.05 μm, in order from the bottom film. Ni films of the multilayerd film forming the metal film 15 are soft magnetic materials. The thickness of the Sn film 16 is, for example, 0.5 μm.

Figure 1C:
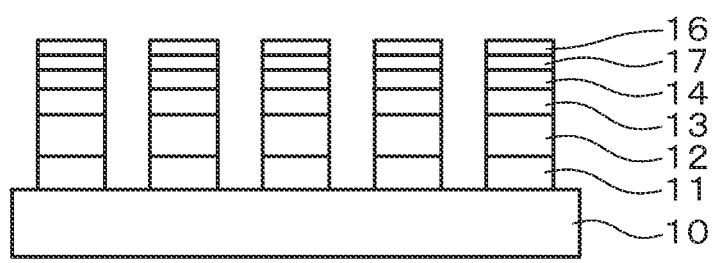
FIG. 1C A cross-sectional view showing the method for manufacturing the vertical micro LED chip which is used in the micro LED integrated device manufacturing method according to the first embodiment of the invention.

Then, as shown in FIG. 1C, the metal film 15 and the Sn film 16 are patterned by lithography and etching to form the p-side electrode 17 and the Sn film 16 having the same planar shape as the p-side electrode 17. Thereafter, by using the Sn film 16 and the p-side electrode 17 as a mask, etching by, for example, a reactive ion etching (ME) method is carried out until the sapphire substrate 10 is exposed. Then, as necessary, alloy treatment is carried out to make the p-side electrode 17 ohmic contact with the p-type GaN layer 14.

Figure 1D:
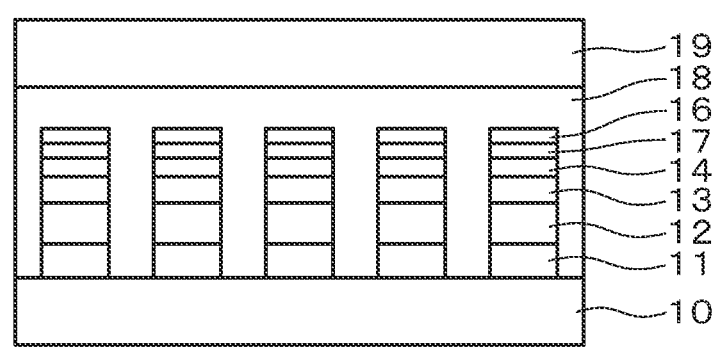
FIG. 1D A cross-sectional view showing the method for manufacturing the vertical micro LED chip which is used in the micro LED integrated device manufacturing method according to the first embodiment of the invention.

Then, as shown in FIG. 1D, covering materials 18 such as resist, transparent resin and the like are coated on the whole surface of the sustrate to cover the surface and thereafter a support substrate 19 such as film, Si substrate and the like is formed thereon.

Figure 2A:
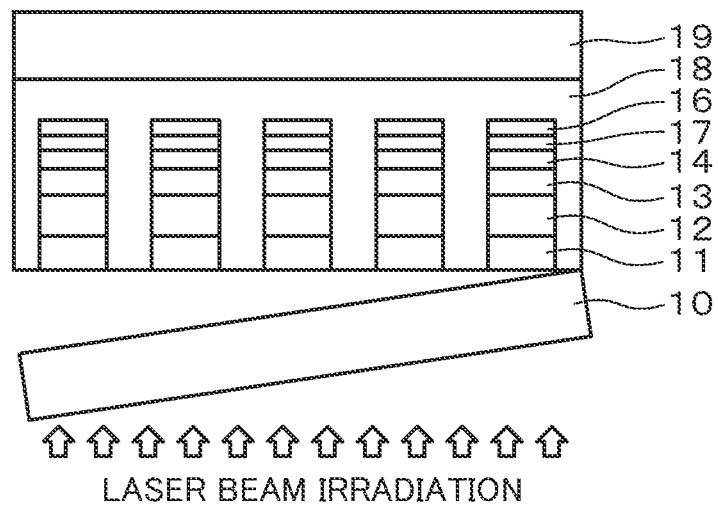
FIG. 2A A cross-sectional view showing the method for manufacturing the vertical micro LED chip which is used in the micro LED integrated device manufacturing method according to the first embodiment of the invention.

Then, as shown in FIG. 2A, a laser beam is irradiated to the back surface of the sapphire substrate 10 to cause separation at the interface between the n-type GaN layer 11 and the sapphire substrate 10, whereby the sapphire substrate 10 is separated from the n-type GaN layer 11 (laser lift-off). Thereafter, the n-type GaN layer 11 is removed by, for example, a chemical and mechanical polishing (CMP) method, the RIE method and the like to expose the surface of the n$^+$-type GaN layer 12.

Figure 2B:
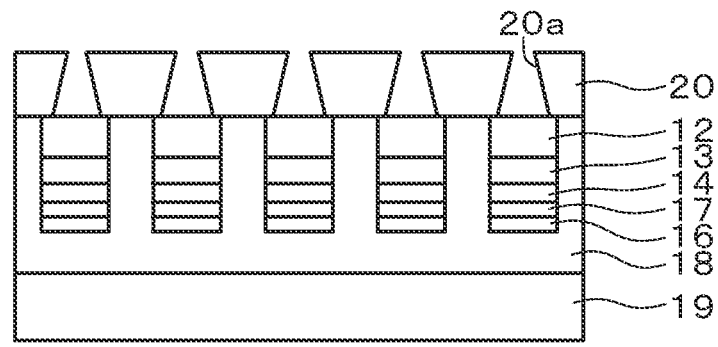
FIG. 2B A cross-sectional view showing the method for manufacturing the vertical micro LED chip which is used in the micro LED integrated device manufacturing method according to the first embodiment of the invention.

Then, as shown in FIG. 2B, formed by lithography is a resist pattern 20 having an opening 20a in the part corresponding to an n-side electrode forming area of the surface of the n$^+$-type GaN layer 12.

Figure 2C:
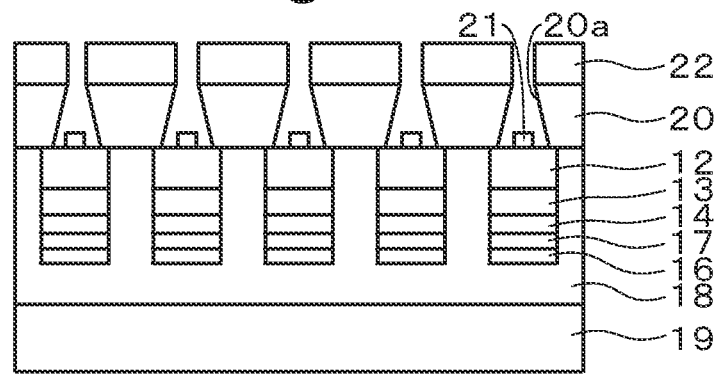
FIG. 2C A cross-sectional view showing the method for manufacturing the vertical micro LED chip which is used in the micro LED integrated device manufacturing method according to the first embodiment of the invention.

Then, an Al film and an Au film are formed in order on the whole surface of the substrate by, for example, the vacuum evaporation method. Here, as shown in FIG. 2C, an n-side electrode (cathode) 21 which comes in contact with the n$^+$-type GaN layer 12 through the opening 20a of the resist pattern 20. A layered film 22 made of the Al film and the Au film is formed on the surface of the resit pattern 20 except the opening 20a. Here, thicknesses of the Al film and the Au film forming the n-side electrode 21 are, for example, 0.3 μm and 0.05 μm, respectively.

Then, the resist pattern 20 is removed together with the layered film 22 formed thereon (lift-off). Thereafter, alloy treatment is carried out to make the n-side electrode 21 ohmic contact with the n$^+$-type GaN layer 12, as necessary.

Figure 3A:
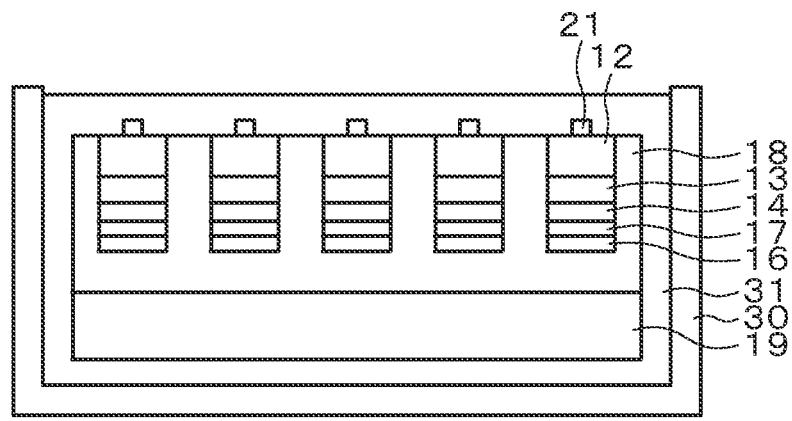
FIG. 3A A cross-sectional view showing the method for manufacturing the vertical micro LED chip which is used in the micro LED integrated device manufacturing method according to the first embodiment of the invention.
Figure 3B:
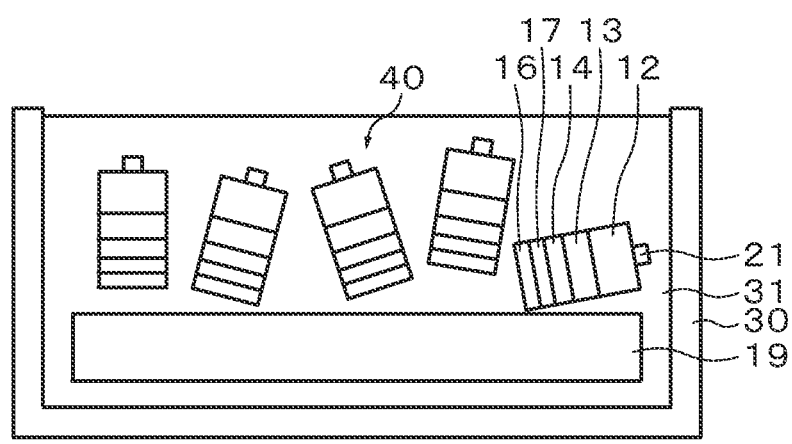
FIG. 3B A cross-sectional view showing the method for manufacturing the vertical micro LED chip which is used in the micro LED integrated device manufacturing method according to the first embodiment of the invention.

Then, as shown in FIG. 3A, the covering materials 18, the Sn film 16, the p-side electrode 17, the p-type GaN layer 14, the light emitting layer 13, the n$^+$-type GaN layer 12 and the n-side electrode 21 formed on the support substrate 19 are immersed in a solvent 31 put in a container 30 to make the covering materials 18 melt. In this way, as shown in FIG. 3B, the vertical micro LED chips 40 are obtained.

The vertical micro LED chips 40 obtained as described above are rinsed by pure water and dried.

Figure 4:
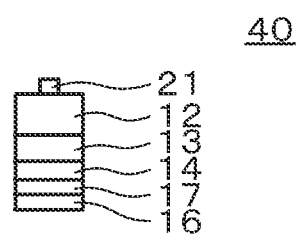
FIG. 4 A cross-sectional view showing the vertical micro LED chip which is used in the micro LED integrated device manufacturing method according to the first embodiment of the invention.

Finally, as shown in FIG. 4, manufactured are the vertical micro LED chips 40, each of which is configured such that the p-side electrode 17 side is more strongly attracted to a magnetic field than the n-side electrode 21 side.

Figure 5A:
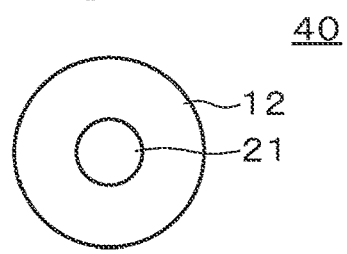
FIG. 5A A plan view showing an example of the planar shape of the vertical micro LED chip which is used in the micro LED integrated device manufacturing method according to the first embodiment of the invention.
Figure 5B:
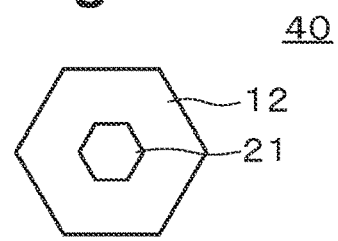
FIG. 5B A plan view showing another example of the planar shape of the vertical micro LED chip which is used in the micro LED integrated device manufacturing method according to the first embodiment of the invention.
Figure 5C:
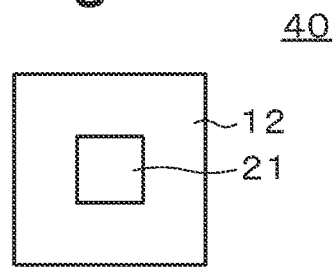
FIG. 5C A plan view showing still another example of the planar shape of the vertical micro LED chip which is used in the micro LED integrated device manufacturing method according to the first embodiment of the invention.

FIG. 5A, FIG. 5B and FIG. 5C show examples of the planar shape of the vertical micro LED chip 40. The vertical micro LED chip 40 may have rotation symmetry to some extent. FIG. 5A shows the case where the planar shape is a circle, FIG. 5B shows the case where the planar shape is a hexagon and FIG. 5C shows the case where the planar shape is a square and general shapes of the vertical micro LED chip 40 shown in FIG. 5A, FIG. 5B and FIG. 5C are a cylinder, a hexagonal prism and a square prism, respectively. The size of the vertical micro LED chip 40 is, for example, (0.1~10 μm)×(0.1~10 μm).

(2) Semiconductor Chip Ink

Figure 6:
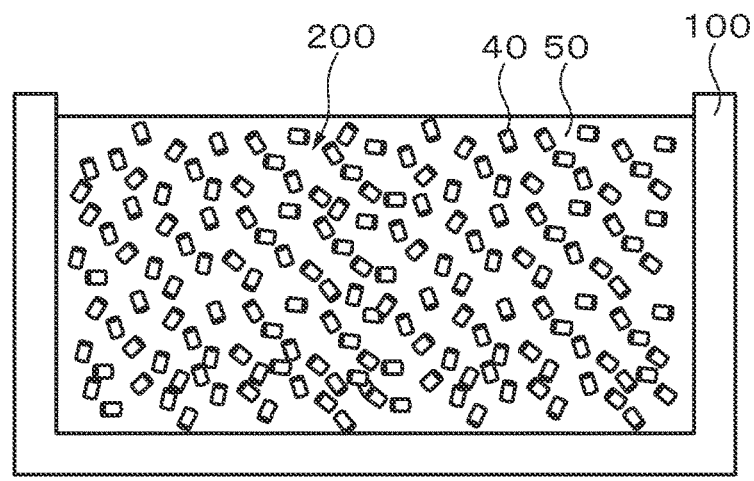
FIG. 6 A schematic view showing a semiconductor chip ink which is used in the micro LED integrated device manufacturing method according to the first embodiment of the invention.

As shown in FIG. 6, a semiconductor chip ink 200 is prepared by dispersing the vertical micro LED chips 40 in a liquid 50 in a container 100. As necessary, fillers, surfactants and the like may be contained in the semiconductor chip ink 200 in addition to the vertical micro LED chips 40. When the size of the vertical micro LED chip 40 is (0.1~10 μm)×(0.1~10 μm), the vertical micro LED chips 40 are dispersed sufficiently well in the semiconductor chip ink 200. Therefore, it is possible to easily eject the semiconductor chip ink 200 from an ejection nozzle of a semiconductor chip ink ejection device.

(3) Semiconductor Chip Ink Ejection Device

FIG. 7 shows a semiconductor chip ink ejection device 300.

As shown in FIG. 7, the semiconductor chip ink ejection device 300 has an inkjet print head 301. The inkjet print head 301 has an ink chamber 302 inside and has a semiconductor chip ink supplying part 303 in the upper part. The inkjet print head 301 has inside also a flow path 305 which connects the side wall of the upper part of the ink chamber 302 and a tube part 303a formed on the base of the semiconductor chip ink supplying part 303 and a flow path 306 which is connected to the side wall of the lower part of the ink chamber 302. A control valve 307 is provided in the midway of the tube part 303a of the semiconductor chip ink supplying part 303. An ejection nozzle 308 is provided below the ink chamber 302. The diameter of the ejection nozzle 308 is selected as necessary and, for example, 10~50 μm. Provided on the ink chamber 302 is a piezoactuator 309 having the structure in which a piezoelectric body is sandwiched between a pair of electrodes. The flow path 306 serves to eject the semiconductor chip ink 200 in the ink chamber 302 outside, or to prevent the ejection nozzle 308 from choking by returnig the ink to the semiconductor chip ink supplying part 303 and circulating, or to obtain stirring function of the semiconductor chip ink 200.

In the semiconductor chip ink ejection device 300, when the control valve 307 is open, the semiconductor chip ink 200 is supplied to the semiconductor chip ink supplying part 303. The semiconductor chip ink 200 which is supplied to the semiconductor chip ink supplying part 303 is supplied to the ink chamber 302 through the tube part 303a and the flow path 305.

The semiconductor chip ink ejection device 300 has also a magnetic field applying device 311 in a position slightly shifted in the horizontal direction from the ejection nozzle 308 of the semiconductor chip ink ejection device 300. A mounting substrate 400 to which the semiconductor chip ink 200 is ejected, which is described later, is moved in the horizontal direction in a position with the height between the inkjet print head 301 and the magnetic field applying device 311.

(4) Mounting Substrate

Figure 8A:
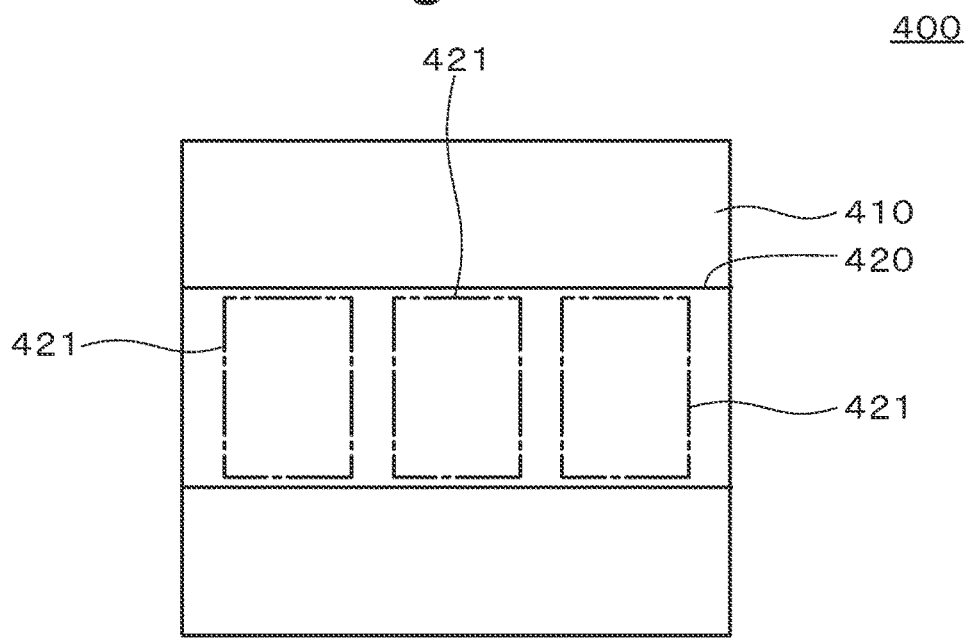
FIG. 8A A plan view showing a mounting substrate which is used in the micro LED integrated device manufacturing method according to the first embodiment of the invention.
Figure 8B:
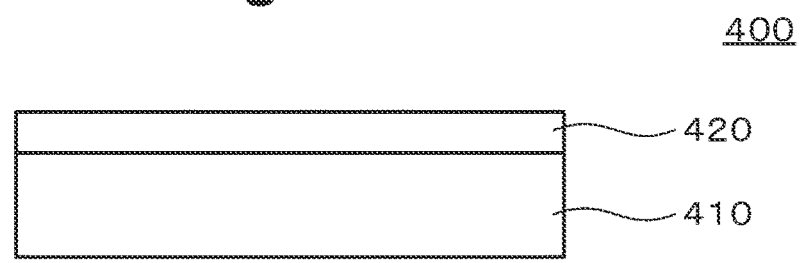
FIG. 8B A cross-sectional view showing the mounting substrate which is used in the micro LED integrated device manufacturing method according to the first embodiment of the invention.

FIG. 8A and FIG. 8B show a mounting substrate 400 which is used to manufacture the micro LED integrated device. Here, FIG. 8A is a plan view and FIG. 8B is a cross-sectional view along the lower electrode. As shown in FIG. 8A and FIG. 8B, a lower electrode 420 having a predetermined shape is formed on one major surface of a substrate 410. The substrate 410 may be rigid or flexible and transparent or opaque and may be selected as necessary. The substrate 410 may be, for example, Si substrate, glass substrate, glassepoxy substrate and the like, or resin film and the like. The lower electrode 420 having the predetermined shape can be formed, for example, by forming a resist pattern having an opening having a predetermined shape on the substrate 410 by lithography, then forming a nonmagnetic metal film on the whole surface by a sputtering method, a vacuum evaporation method and the like and finally lifting off the resist pattern. The metal film is made of nonmagnetic metal, for example, a Ti/Al/Ti/Au/Ti layered film, but a Cu (or Cu alloy)/Au/Ti layered film can be also used. Thicknesses of films forming the Ti/Al/Ti/Au/Ti layered film are, for example, 5~10 nm, 300~1000 nm, 50 nm, 5~10 nm, 50 nm in order from the bottom film. Chip joining parts 421 are formed on the lower electrode 420. Each of the chip joining parts 421 is an area on which a circuit unit is formed.

(5) Micro LED Integrated Device Manufacturing Method

Described is a micro LED integrated device manufacturing method based on the above description.

Figure 9:
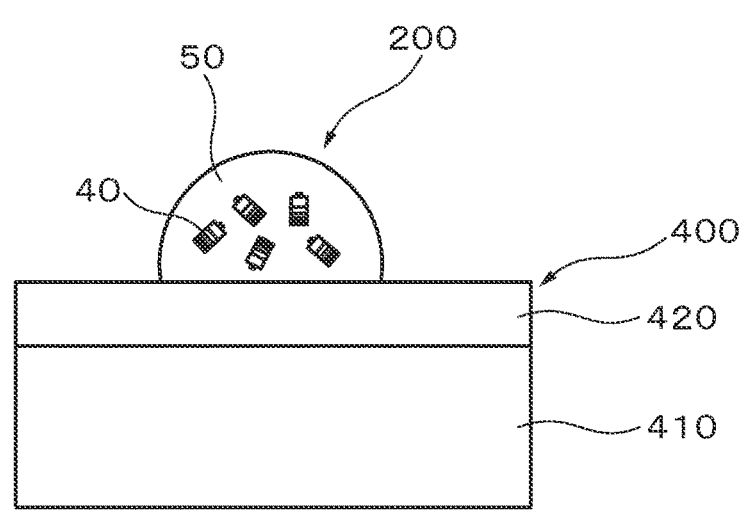
FIG. 9 A cross-sectional view showing the state where the semiconductor chip ink is ejected to the chip joining part of the mounting substrate in the micro LED integrated device manufacturing method according to the first embodiment of the invention.

As shown in FIG. 7, the mounting substrate 400 is placed horizontally below the ejection nozzle 308 of the semiconductor chip ink ejection device 300. In this case, the semiconductor chip ink ejection device 300 is fixed and the mounting substrate 400 is moved by a transporting mechanism not illustrated in a direction shown by the arrow in FIG. 7 in the horizontal plane. The semiconductor chip ink 200 is ejected to the chip joining part 421 of the mounting substrate 400 from the ejection nozzle 308 by operating the piezoactuator 309. As necessary, the semiconductor chip ink 200 may be ejected to the chip joining part 421 a plurality of times. A droplet of the semiconductor chip ink 200 formed in this way contains at least a plurality of the vertical micro LED chips 40. The number of the vertical micro LED chips 40 contained in a droplet of the semiconductor chip ink 200 can be adjusted by the concentration of the vertical micro LED chips 40 in the semiconductor chip ink 200, the number of times of ejection and the like. FIG. 9 shows the semiconductor chip ink 200 in this state. In this case, the volume of a droplet of the semiconductor chip ink 200 is, for example, 1~10 picoliters. The volume of the vertical micro LED chip 40 is generally 0.001~0.5 picoliters. For example, if the vertical micro LED chip 40 has a circular shape having the diameter of 10 µm and the thickness of 5 µm, its volume is about 0.4 picoliters. If the vertical micro LED chip 40 has a circular shape having the diameter of 1 µm and the thickness of 3 µm, its volume is about 0.0024 picoliters.

Figure 10:
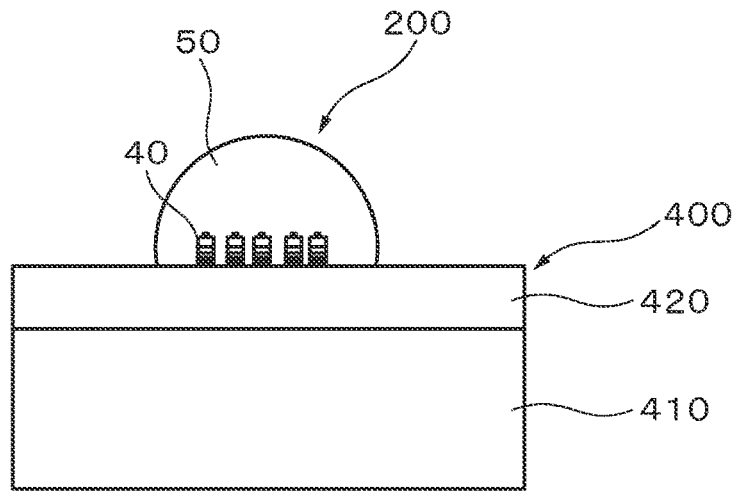
FIG. 10 A cross-sectional view showing the state where the vertical micro LED chips in the semiconductor chip ink ejected to the chip joining part of the mounting substrate are made contact with the chip joining part in the micro LED integrated device manufacturing method according to the first embodiment of the invention.

Then, as shown by the arrow in FIG. 7, the mounting substrate 400 is moved by the transporting mechanism not illustrated by a predetermined distance such that the chip joining part 421 to which the semiconductor chip ink 200 is ejected positions over the magnetic field applying device 311 and thereafter the magnetic field is applied by the magnetic field applying device 311 to magnetize the Ni films contained in the p-side electrodes 17 of the vertical micro LED chips 40 contained in the semiconductor chip ink 200. Therefore, each of the vertical micro LED chips 40 is attracted downwardly in the semiconductor chip ink 200 by a magnetic force and finally made in contact with the chip joining part 421 with the p-side electrode 17 facing downward. This situation is shown in FIG. 10. In this state, the vertical micro LED chips 40 are made in contact with the chip joining part 421 in random arrangement. In order to prevent the vertical micro LED chips 40 from falling or shifting due to external factors such as vibration, perturbation and the like, application of the magnetic field by the magnetic field applying device 310 is carried out preferably at a time point before ejection of the semiconductor chip ink 200 or at the time of ejection or at a time point from the time of ejection and before the liquid of the semiconductor chip ink 200 evaporates, for example within 60 seconds from the time of ejection.

Then, the solvent of the semiconductor chip ink 200 is heated to evaporate by lamp and the like while each of the vertical micro LED chips 40 is made contact with the chip joining part 42 by the magnetic force, and subsequently the Sn film 16 of each of the vertical micro LED chips 40 is heated by lamp, laser and the like to make melt. Thereafter, by cooling of the molten Sn, the p-side electrode 17 of the vertical micro LED chip 40 is joined electrically and mechanically to the chip joining part 421 of the lower electrode 420.

Figure 11A:
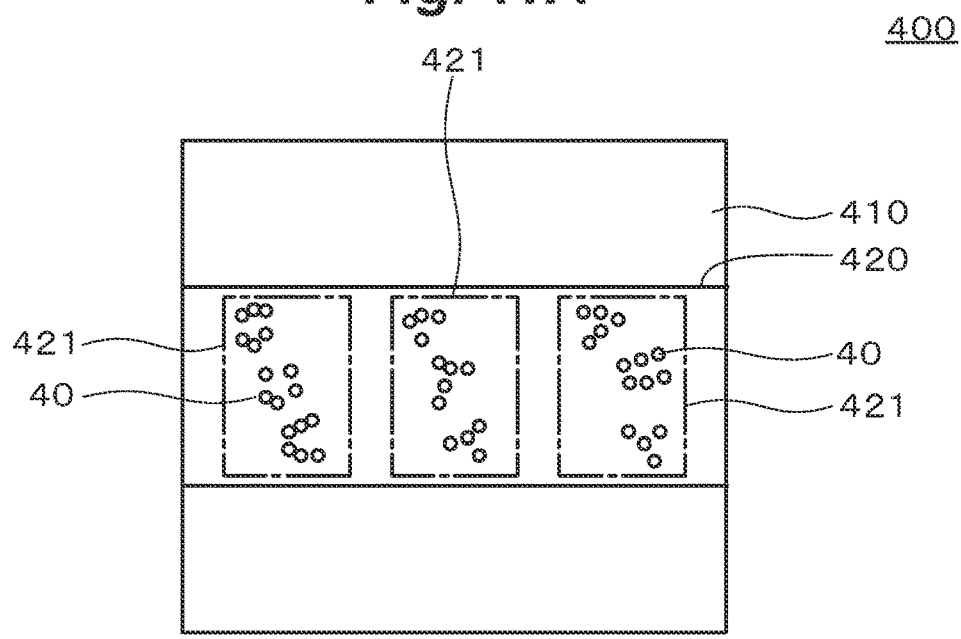
FIG. 11A A plan view showing the state where the vertical micro LED chips are joined to the chip joining parts of the mounting substrate in the micro LED integrated device manufacturing method according to the first embodiment of the invention.
Figure 11B:
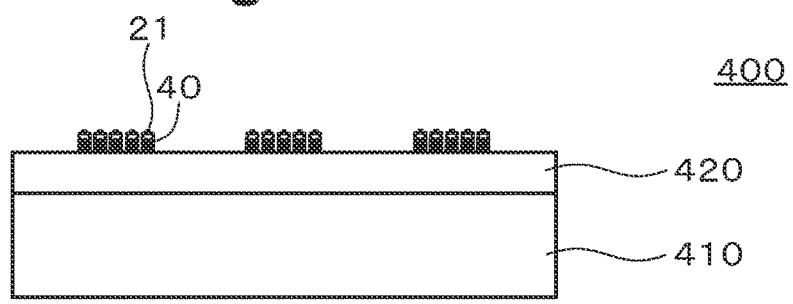
FIG. 11B A cross-sectional view showing the state where the vertical micro LED chips are joined to the chip joining parts of the mounting substrate in the micro LED integrated device manufacturing method according to the first embodiment of the invention.

Similarly, the p-side electrode 17 of the vertical micro LED chips 40 is joined electrically and mechanically to each of the chip joining part 421 of the lower electrode 420. FIG. 11A and FIG. 11B show this state. Here, FIG. 11A is a plan view and FIG. 11B is a cross-sectional view. As shown in FIG. 11A, the vertical micro LED chips 40 are joined to each chip joining part 421 in random arrangement.

Figure 12A:
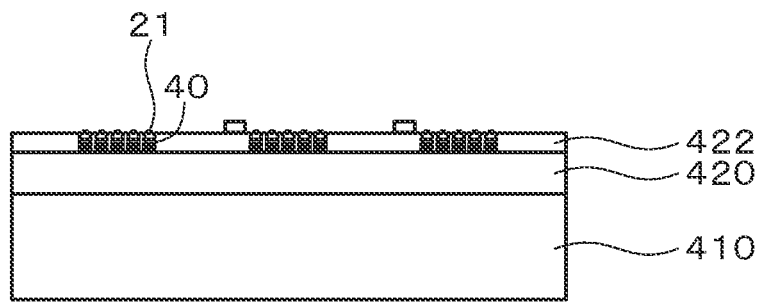
FIG. 12A A cross-sectional view showing the micro LED integrated device manufacturing method according to the first embodiment of the invention.

Then, as shown in FIG. 12A, after an insulating film 422 is formed on the whole surface of the mounting substrate 400 in which the vertical micro LED chips 40 are joined to the chip joining part 421 such that the surface of the insulating film 422 is almost flat, the insulating film 422 is etched by, for example, the RIE method to expose the n-side electrode 21.

Figure 12B:
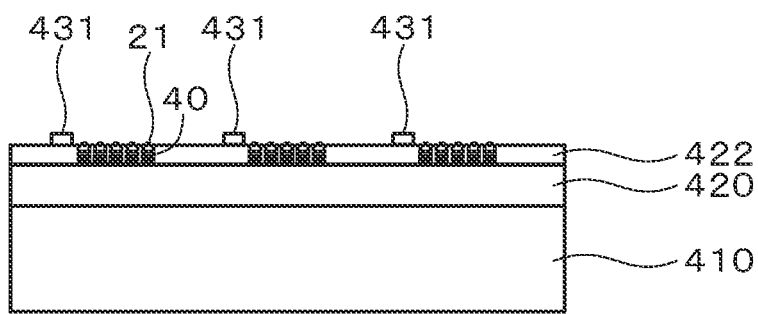
FIG. 12B A cross-sectional view showing the micro LED integrated device manufacturing method according to the first embodiment of the invention.

Then, as shown in FIG. 12B, formed on the insulating film 422 is a plurality of upper electrode main line parts 431 which extend in the direction at a right angle to the lower electrode 420 and are parallel to each other.

Figure 12C:
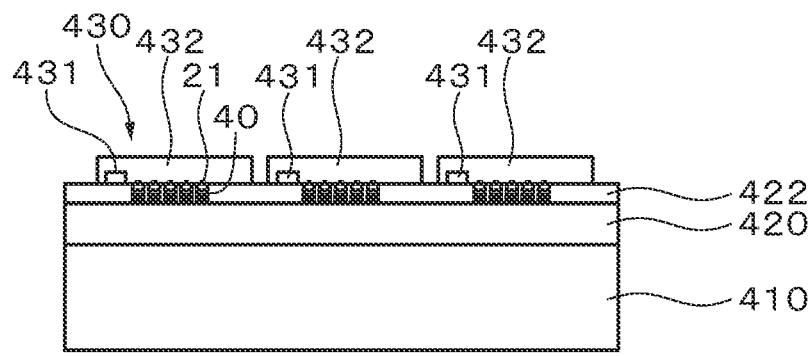
FIG. 12C A cross-sectional view showing the micro LED integrated device manufacturing method according to the first embodiment of the invention.
Figure 13:
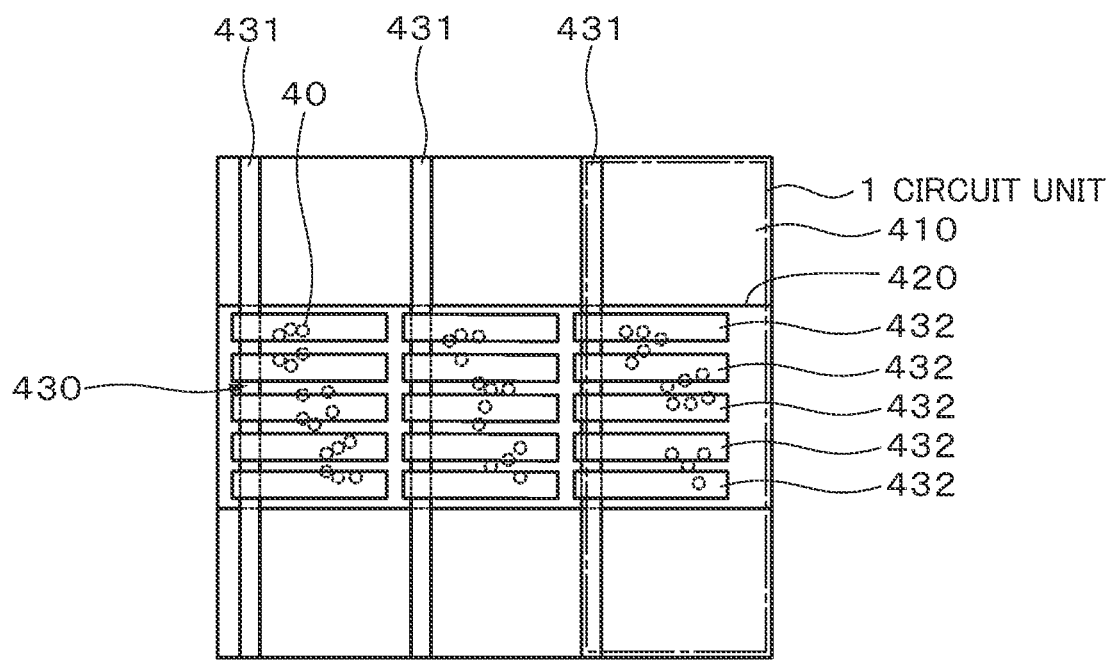
FIG. 13 A plan view showing the micro LED integrated device manufacturing method according to the first embodiment of the invention.

Then, as shown in FIG. 12C, formed on the insulating film 422 parallel to each other are a plurality of transparent electrodes 431 for each chip joining part 421 which connect the n-side electrodes 21 of the vertical micro LED chip 40 and the upper electrode main line parts 431 (in this example, the number of transparent electrodes 431 is 5). The transparent electrodes 432 are formed such that they cover almost the whole of each chip joining part 421. The transparent electrode 431 forms an upper electrode branch line parts and the upper electrode main line parts 431 and the transparent electrode 431 form an upper electrode 430. FIG. 13 shows a plan view of this state. As shown in FIG. 13, the transparent electrodes 432 are formed such that they extend over the vertical micro LED chips 40 which are randomly arranged on each chip joining part 421. Among the transparent electrodes 432, there may be transparent electrodes 432, a part of which is made contact with the n-side electrode 21, or there may be transparent electrodes 432 which are not made contact with the n-side electrode 21. However, a part of at least one transparent electrode 432 is made contact with the n-side electrode 21 of at least one, typically a plurality of vertical micro LED chips 40. In FIG. 13, an area covered by a circuit unit which on/off can be controlled electrically. The light emitting area of a vertical micro LED chip 40 is typically selected to be not larger than a thousandth of the area covered by one circuit unit.

Figure 14A:
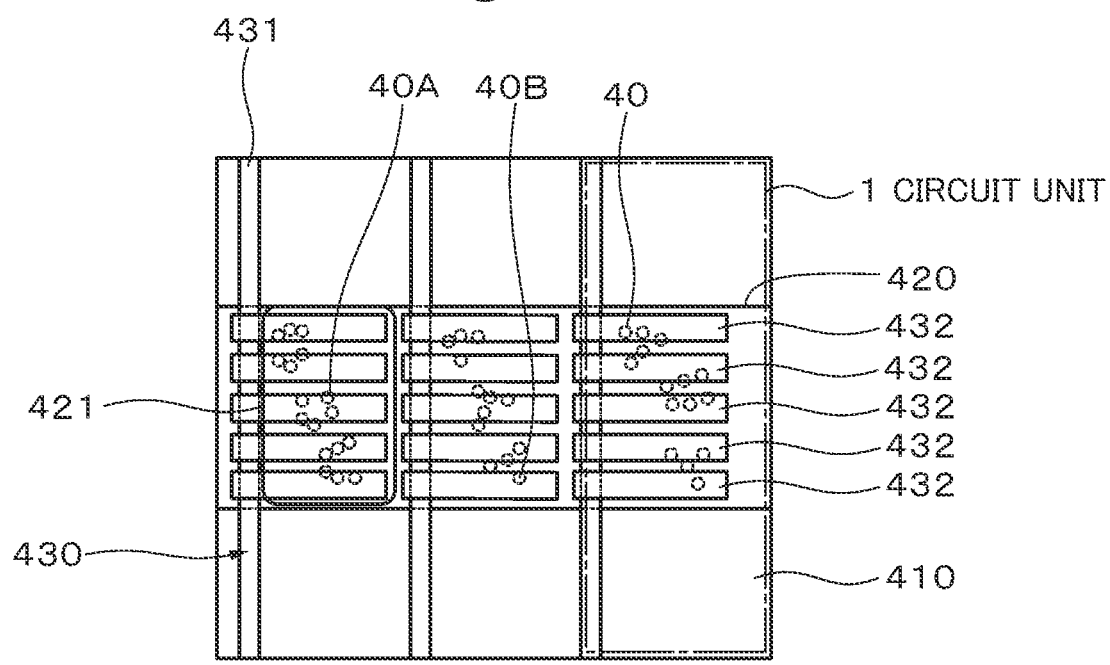
FIG. 14A A plan view for explaining a method for testing the micro LED integrated device manufactured by the micro LED integrated device manufacturing method according to the first embodiment of the invention.
Figure 14B:
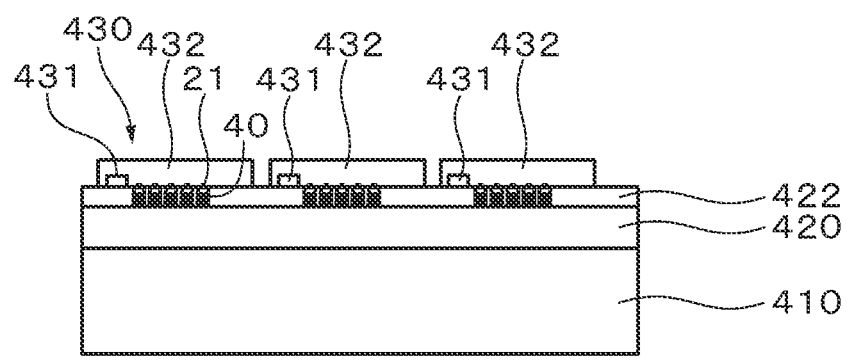
FIG. 14B A cross-sectional view for explaining the method for testing the micro LED integrated device manufactured by the micro LED integrated device manufacturing method according to the first embodiment of the invention.

Thereafter, a test of the micro LED integrated device manufactured as described above is carried out. More specifically, a voltage is applied between the upper electrode 430 and the lower electrode 420 such that the voltage of the lower electrode 420 is higher than the upper electrode 430 to make current flow through each vertical micro LED chip 40. And image analysis of emission of light of each vertical micro LED chip 40 is carried out to find the transparent electrode 432 covering inferior vertical micro LED chips 40. In FIG. 14A and FIG. 14B, the inferior vertical micro LED chips 40 are shown by reference numerals 40A and 40B.

Figure 15A:
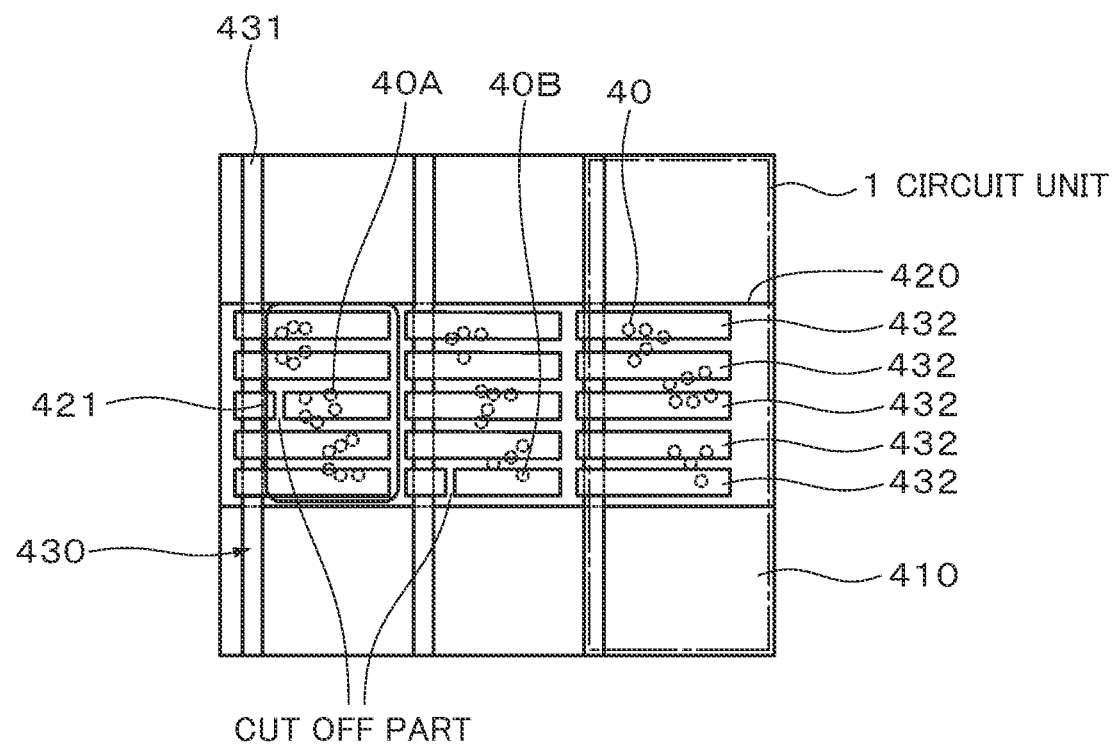
FIG. 15A A plan view for explaining a method for repairing the micro LED integrated device manufactured by the micro LED integrated device manufacturing method according to the first embodiment of the invention.
Figure 15B:
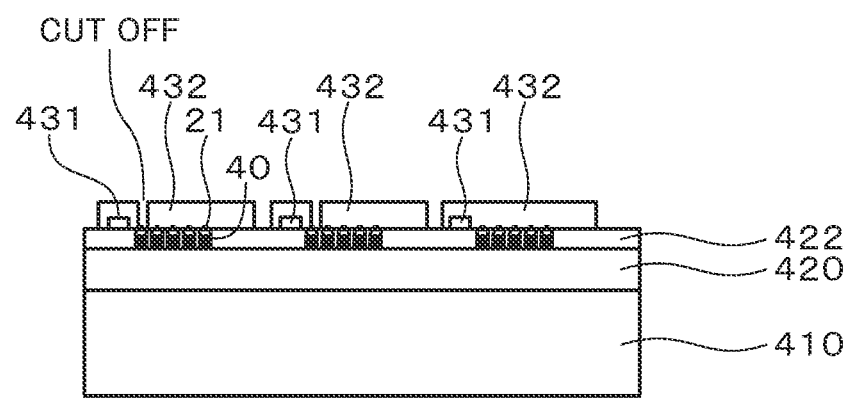
FIG. 15B A cross-sectional view for explaining the method for repairing the micro LED integrated device manufactured by the micro LED integrated device manufacturing method according to the first embodiment of the invention.

Then, for example, a laser beam is irradiated to a part of the transparent electrode 432 covering the inferior vertical micro LED chips 40 found as described above to cut off or remove the part of the transparent electrode 432. As a result, the inferior vertical micro LED chips 40 are separated from the upper electrode 430. FIG. 15A and FIG. 15B show the state where a part of the transparent electrode 432 is cut off. In this way, the micro LED integrated device can be repaired.

(6) Structure of the Micro LED Integrated Device

As shown in FIG. 12C and FIG. 13 or FIG. 15A and FIG. 15B, the micro LED integrated device has the mounting substrate 400 having the lower electrode 420 on one major surface, the chip joining parts 421 formed on the lower electrode 420, a plurality of vertical micro LED chips 40, each of which has the n-side electrode 21 and the p-side electrode 17 on the upper surface and the lower surface and is configured such that the p-side electrode 17 side is more strongly attracted to a magnetic field than the n-side electrode 21 side, which are joined to the chip joining parts 421 in random arrangement, and the upper electrode 430 as the upper layer of the vertical micro LED chips 40 having the upper electrode main line part 431 and a plurality of branch line parts, that is, the transparent electrodes 432 which branch from the upper electrode main line part 431. And, the vertical micro LED chips 40 are joined to the chip joining part 421 such that the p-side electrode 17 side faces the chip joining part 421. The n-side electrode 21 and the upper electrode 430 are electrically connected with each other. The n-side electrode 21 of at least one vertical micro LED chip 40 and the transparent electrodes 432 of the upper electrode 430 are electrically connected with each other.

As described above, according to the first embodiment, the vertical micro LED chip 40 is configured such that the p-side electrode 17 side is more strongly attracted to a magnetic field than the n-side electrode 21 side by using the p-side electrode 17 containing the Ni films, which are soft magnetic materials, whereas a plurality of chip joining parts 421 are formed, for example in a two-dimensional array, on the lower electrode 420 of the mounting substrate 400. And the semiconductor chip ink 200 containing a plurality of vertical micro LED chips 40, usually a large number of vertical micro LED chips 40 is ejected to the chip joining part 421 of the lower electrode 420 of the mounting substrate 400 from the ejection nozzle 308 of the inkjet print head 301 of the semiconductor chip ink ejection device 300. The p-side electrode 17 side of the vertical type micro LED chip 40 is attracted to the chip joining part 421 of the lower electrode 420 by a magnetic force to make contact with the chip joining part 421. Thereafter, the vertical micro LED chip 40 and the chip joining part 421 of the lower electrode 420 are joined electrically and mechanically by making melt and solidifying the Sn film 16, whereby a micro LED integrated device such as, for example, a micro LED display, a micro LED backlight, a micro LED illumination device and the like can be easily realized in low cost. Furthermore, since it is sufficient to join the vertical micro LED chips 40 to the chip joining part 421 in random arrangement, high precision position control of the vertical micro LED chips 40 is not necessary, which simplifies manufacturing of the vertical micro LED chips 40. Since a plurality of vertical micro LED chips 40 are joined to each chip joining part 421 in random arrangement and a plurality of the transparent electrodes 432 extend from the upper electrode main line part 431 so as to cover almost all of the chip joining part 421, it is possible to prevent the case where no vertical micro LED chips 40 is connected between the lower electrode 420 and the upper electrode 430 in each circuit unit from occurring. Therefore, it is possible to prevent failure of the micro LED integrated device from occurring. Furthermore, even if there occur inferior vertical micro LED chips 40 on the mounting substrate 400, it is possible to repair by cutting off the transparent electrodes 432 of the upper electrode 430 to which the inferior vertical micro LED chips 40 are connected.

The Second Embodiment

Micro LED Integrated Device Manufacturing Method

Figure 16:
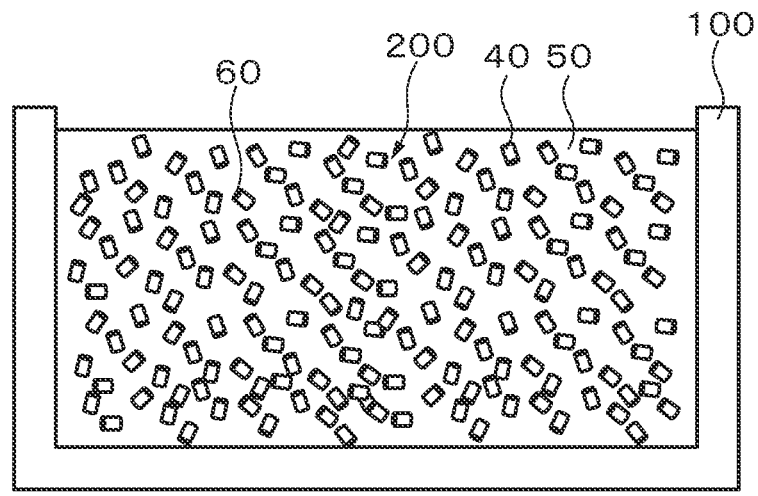
FIG. 16 A schematic view showing a semiconductor chip ink which is used in a micro LED integrated device manufacturing method according to a second embodiment of the invention.
Figure 17:
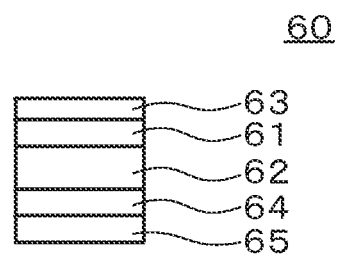
FIG. 17 A cross-sectional view showing a Zener diode contained in the semiconductor chip ink which is used in the micro LED integrated device manufacturing method according to the second embodiment of the invention.

According to the second embodiment, as shown in FIG. 16, the semiconductor chip ink 200 is prepared by dispersing not only the vertical micro LED chips 40 but also Zener diodes 60 in the liquid 50 in the container 100. FIG. 17 shows an example of the Zener diode 60. As shown in FIG. 17, the Zener diode 60 has a pn junction made of a p-type layer 61 and an n-type layer 62. A p-side electrode 63 is formed on the p-type layer 61, an n-side electrode 64 is formed on the n-type layer 62 and a Sn film 65 is formed on the n-side electrode 64. In this case, the n-side electrode 64 contains Ni films. Therefore, the Zener diode 60 is configured such that the n-side electrode 64 side is more strongly attracted to a magnetic field than the p-side electrode 63 side. As necessary, fillers, surfactants and like may be contained in addition to the vertical micro LED chips 40 and the Zener diodes 60 in the semiconductor chip ink 200. The Zener diodes 60 are added, typically, in a ratio not larger than a tenth of the vertical micro LED chips 40.

Figure 18:
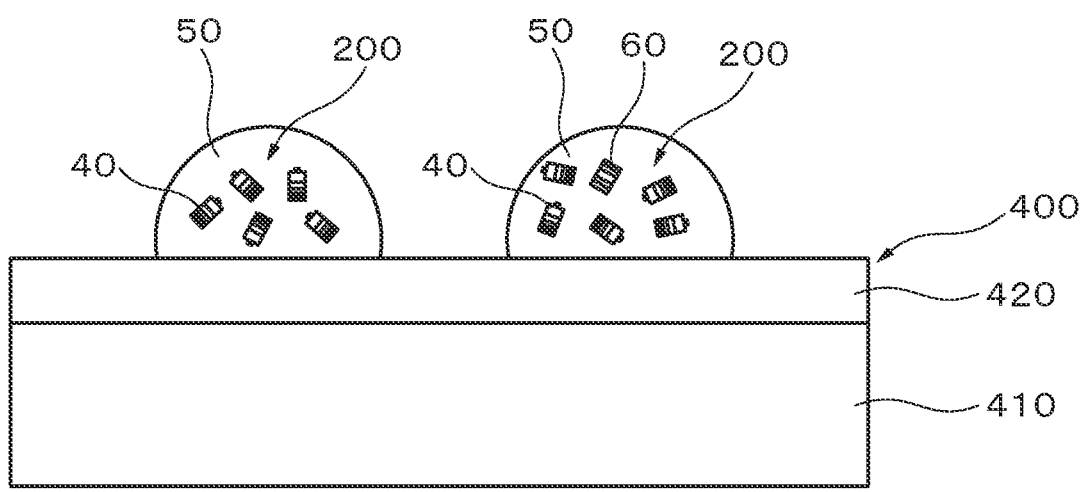
FIG. 18 A cross-sectional view showing the state where the semiconductor chip ink is ejected to the chip joining parts of the mounting substrate in the micro LED integrated device manufacturing method according to the second embodiment of the invention.
Figure 19:
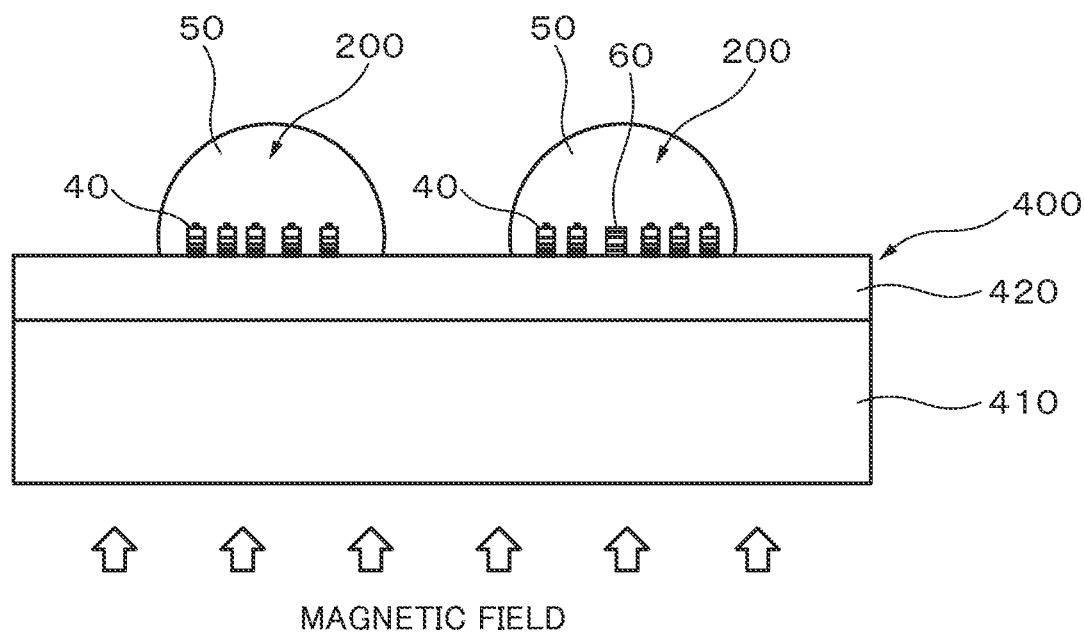
FIG. 19 A cross-sectional view showing the state where the vertical micro LED chips in the semiconductor chip ink ejected to the chip joining parts of the mounting substrate are made contact with the chip joining parts in the micro LED integrated device manufacturing method according to the second embodiment of the invention.

As the same as the first embodiment, the semiconductor chip ink 200 is ejected to the chip joining part 421 of the lower electrode 420 of the mounting substrate 400. FIG. 18 shows the state where the semiconductor chip ink 200 is ejected to the chip joining part 421. FIG. 18 shows the case where one of the semiconductor chip inks 200 ejected to two chip joining parts 421 adjacent to each other contains only the vertical micro LED chips 40 and the other contains the vertical micro LED chips 40 and the Zener diodes 60. Thereafter, as shown in FIG. 19, as the same as the first embodiment, a magnetic field is applied by the magnetic field applying device 311. As a result, the Ni films contained in the p-side electrode 17 of a plurality of vertical micro LED chips 40 contained in the semiconductor chip ink 200 are magnetized and each vertical micro LED chip 40 is made contact with the chip joining part 421 such that the p-side electrode 17 side faces downward. Also, the Ni films contained in the n-side electrode 64 of a plurality of Zener diodes 60 contained in the semiconductor chip ink 200 are magnetized and each Zener diode 60 is made contact with the chip joining part 421 such that the n-side electrode 64 side faces downward.

Thereafter, as the same as the first embodiment, the semiconductor chip ink 200 ejected to the chip joining parts 421 is dried and then the Sn film 16 of each vertical micro LED chip 40 and the Sn film 65 of each Zener diode 60 are made to melt and solidify, whereby the vertical micro LED chips 40 and the Zener diode 60 are connected electrically and mechanically with the the chip joining parts 421.

Figure 20:
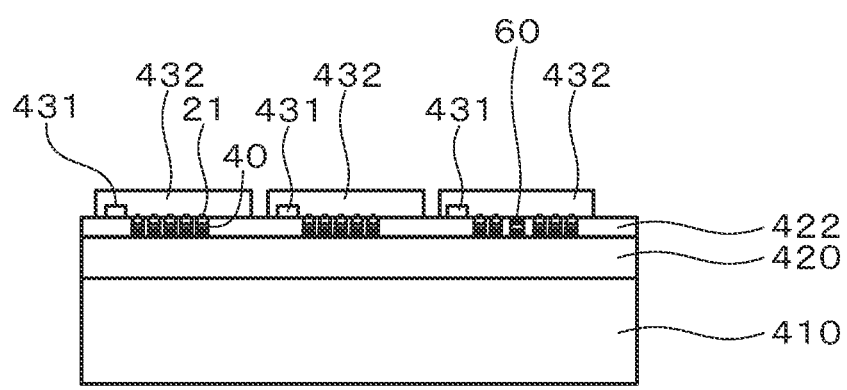
FIG. 20 A cross-sectional view showing the micro LED integrated device manufacturing method according to the second embodiment of the invention.

Thereafter, processes are carried out as the same as the first embodiment to manufacture the micro LED integrated device as shown in FIG. 20. The plan view of the state shown in FIG. 20 is as the same as FIG. 13.

Micro LED Integrated Device

As shown in FIG. 20, the micro LED integrated device has the similar structure as the micro LED integrated device according to the first embodiment except that the vertical micro LED chips 40 are connected between the lower electrode 420 and the upper electrode 430 and further the Zener diodes 60 are also connected such that they are reversely biased.

According to the second embodiment, another advantage can be obtained in addition to the same advantages as the first embodiment. That is, the Zener diodes 60 are connected between the lower electrode 420 and the upper electrode 430 such that they are reversely biased. Therefore, when surge voltage and the like is applied between the lower electrode 420 and the upper electrode 430, current can flow through the the Zener diodes 60. As a result, it is possible to prevent the micro LED integrated device from breaking.

The Third Embodiment

Micro LED Integrated Device Manufacturing Method

In the first embodiment, ejection of the semiconductor chip ink 200 and subsequent mounting of the vertical micro LED chips 40 on the mounting substrate 400 are carried out by using the semiconductor chip ink ejection device 300 and the magnetic field applying device 311 shown in FIG. 7. The third embodiment differs from the first embodiment in that ejection of the semiconductor chip ink 200 and subsequent mounting of the vertical micro LED chips 40 on the mounting substrate 400 are carried out by using the semiconductor chip ink ejection device 300, the magnetic field applying devices 311, 312, 313 and heating devices 321, 322 shown in FIG. 21.

Figure 21:
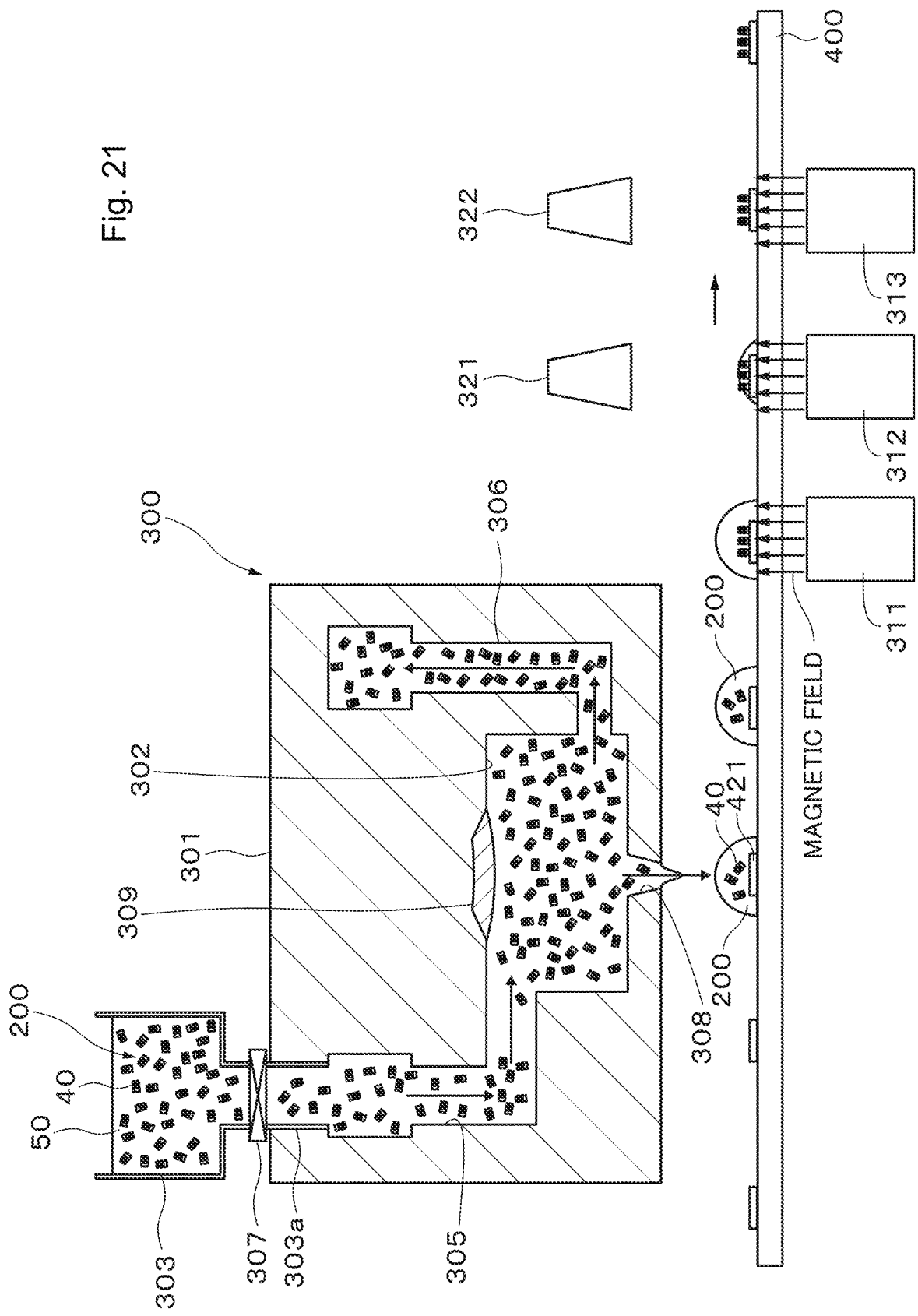
FIG. 21 A schematic view showing a semiconductor chip ink ejection device which is used in a micro LED integrated device manufacturing method according to a third embodiment of the invention.

As shown in FIG. 21, the magnetic field applying devices 311, 312, 313 are placed at positions sequentially away from the inkjet print head 301 in the horizontal direction. The heating device 321 using a lamp and the like is disposed over the magnetic field applying device 312. The heating device 321 is used to evaporate the solvent of the semiconductor chip ink 200. The heating device 322 using a lamp, a laser and the like is disposed over the magnetic field applying device 313. The heating device 322 is used to make melt the Sn film 16 of the vertical micro LED chip 40. The heating devices 321, 322 are disposed at predetermined heights such that the mounting substrate 400 is sandwiched between the magnetic field applying devices 311, 312, 313 and the heating devices 321, 322. The mounting substrate 400 is moved at a height between the inkjet print head 301 and the magnetic field applying devices 311, 312, 313.

In the third embodiment, as the same as the first embodiment, the semiconductor chip ink 200 is ejected to the chip joining part 421 of the lower electrode 420 of the mounting substrate 400, while the magnetic field is applied by the magnetic field applying device 311 at a time point before ejection of the semiconductor chip ink 200 or at the time of ejection or at a time point within 60 seconds from the time of ejection. While each of the vertical micro LED chips 40 are made contact with the chip joining part 421 by a magnetic force, the mounting substrate 400 is moved further and at a time point where the chip joining part 421 with which the vertical micro LED chips 40 are made contact reaches just below the heating decice 321, heating is carried out by a lamp and the like to evaporate the liquid of the semiconductor chip ink 200. In the state where the chip joining part 421 with which the vertical micro LED chips 40 are made contact reaches just below the heating decice 321, the contact state of the vertical micro LED chips 40 with the chip joining part 421 is kept by applying a magnetic field by the magnetic field applying device 312. Then, the mounting substrate 400 is moved further and at a time point where the chip joining part 421 with which the vertical micro LED chips 40 are made contact reaches just below the heating decice 322, heating is carried out by a lamp, a laser and the like to make melt the Sn film 16. During this period, the contact state of the vertical micro LED chips 40 with the chip joining part 421 is kept by applying a magnetic field by the magnetic field applying device 313. Thereafter, while the mounting substrate 400 is moved further, molten Sn is cooled to solidify, whereby the p-side electrode 17 of each vertical micro LED chip 40 is joined electrically and mechanically to the chip joining part 421.

Similarly, the p-side electrode 17 of the vertical micro LED chip 40 is joined electrically and mechanically to each chip joining part 421.

Others are the same as the first embodiment.

According to the third embodiment, another advantage can be obtained in addition to the same advantages as the first embodiment. That is, steps from ejection of the semiconductor chip ink 200 to the chip joining part 421 of the mounting substrate 400 to electrical and mechanical joining of the vertical micro LED chips 40 to the chip joining part 421 can be continuously and easily carried out.

The Fourth Embodiment

Color Micro LED Display

In the fourth embodiment, a passive matrix driving system color micro LED display is described.

Figure 22:
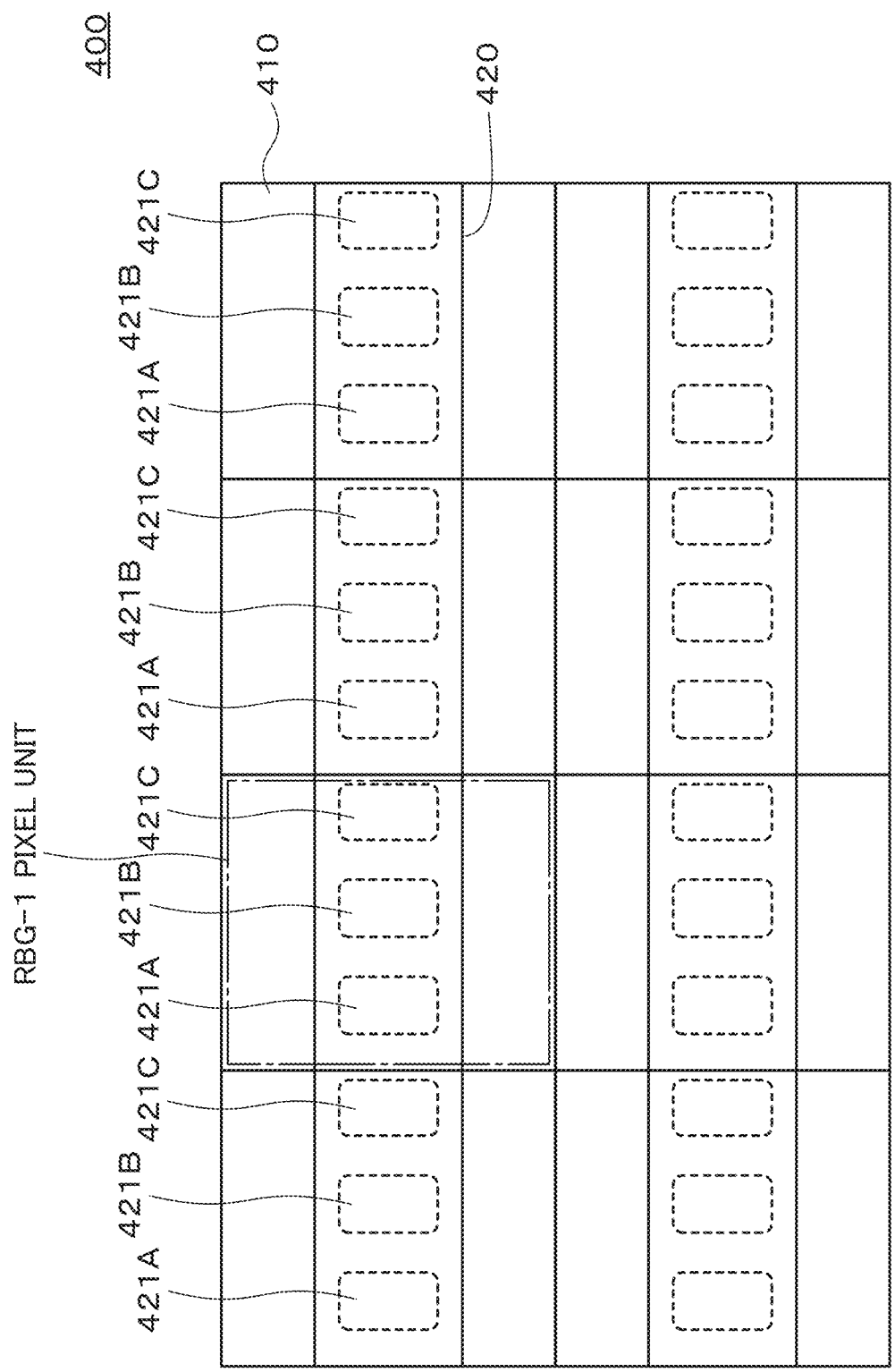
FIG. 22 A plan view showing a mounting substrate of a passive driving system color micro LED display according to a fourth embodiment of the invention.

FIG. 22 shows lower electrodes 420 on the mounting substrate 400 of the color micro LED display. As shown in FIG. 22, lower electrodes 420 are formed parallel to each other in the row direction. RGB-1 pixel units, each of which is formed by arranging light emitting areas of each of RGB adjacently each other along each lower electrode 420 are arranged and as a whole of the mounting substrate 400 pixels are arranged in a two dimensional matrix. In each pixel, three chip joining parts 421A, 421B, 421C are formed on the lower electrode 420 and they correspond to, for example, light emitting areas of each of B, R, G.

Figure 23:
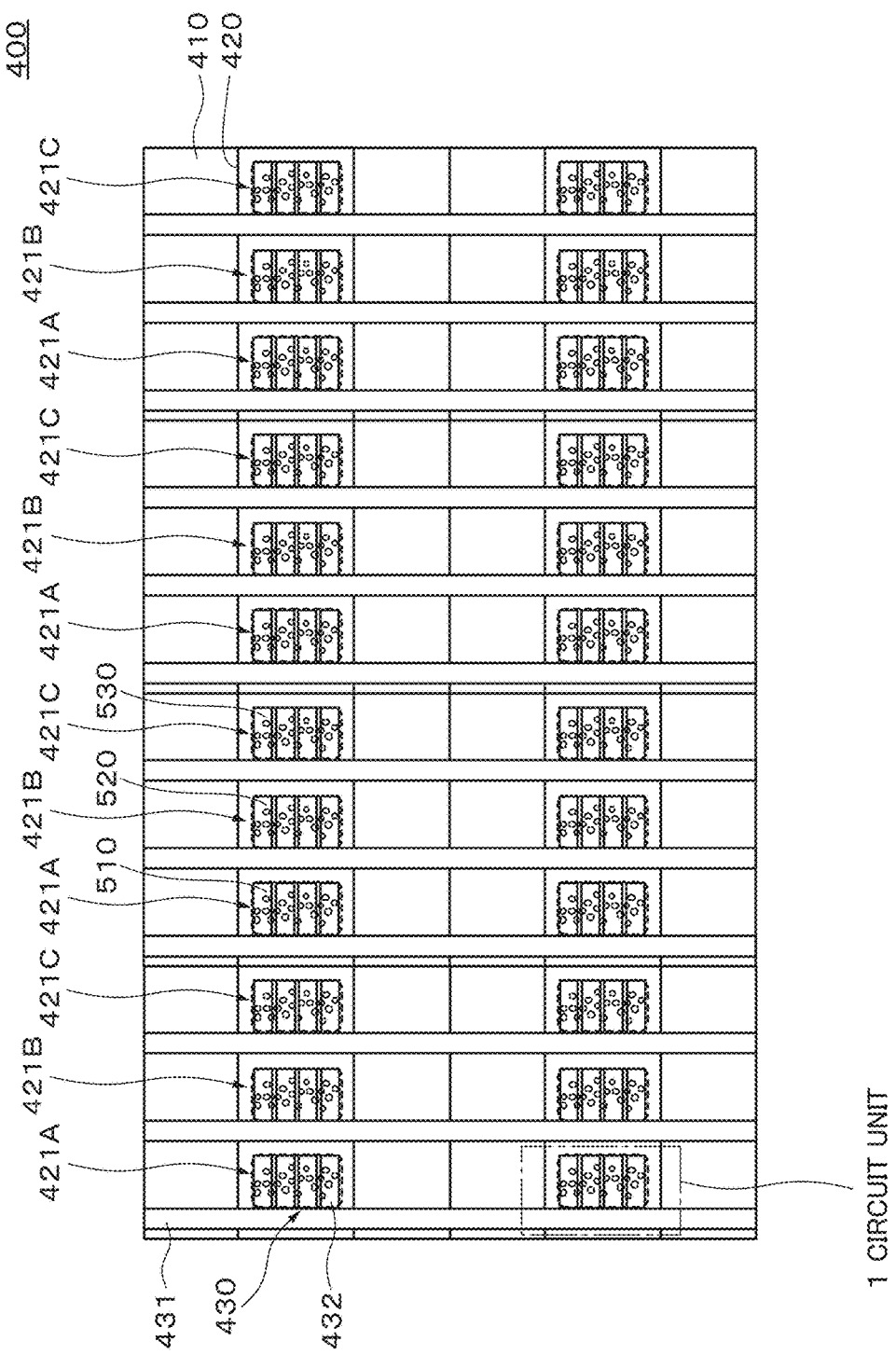
FIG. 23 A plan view showing the passive driving system color micro LED display according to the fourth embodiment of the invention.

FIG. 23 shows the state where vertical micro LED chips for light emission of each of RGB are mounted on the mounting substrate 400 as the same as the first embodiment and the upper electrode 430 is formed. More specifically, blue light emission vertical micro LED chips 510 are randomly arranged on the chip joining part 421A, red light emission vertical micro LED chips 520 are randomly arranged on the chip joining part 421B and green light emission vertical micro LED chips 530 are randomly arranged on the chip joining part 421C. The upper electrode 430 is formed along each chip joining part 421A in the column direction. Each transparent electrode 432 forming the branch line part of each upper electrode 420 is connected with an n-side electrode of the vertical micro LED chips 510 on the chip joining part 421A, to an n-side electrode of the vertical micro LED chips 520 on the chip joining part 421B and to an n-side electrode of the vertical micro LED chips 530 on the chip joining part 421C. Selection of light emitting areas of each pixel is carried out by selection of the lower electrode 420 and the upper electrode 430. FIG. 23 shows a 1 circuit unit. The number of the vertical micro LED chips in 1 circuit unit is typically not less than 10.

The blue light emission vertical micro LED chip 510 and the green light emission vertical micro LED chip 530 have the same structure as the vertical micro LED chip 40 although composition of their light emitting layers 13 are different each other. The red light emission vertical micro LED chip 520 uses AlGaInP-based semiconductor and uses an $n^+$-type AlGaInP layer, a light emitting layer having InxGa1-xP/InyGa1-yP MQW structure and a p-type AlGaInP layer instead of the $n^+$-type GaN layer 12, the light emitting layer 13 and the p-type GaN layer 14 of the vertical type micro LED chip 40. A p-side electrode is formed on the p-type AlGaInP layer and an n-side electrode is formed on the $n^+$-type AlGaInP layer. The p-side electrode contains Ni films and the like as soft magnetic materials. Some manufacturing methods of the red light emission AlGaInP-based semiconductor vertical micro LED chip are known. Although details of steps are omitted, the red light emission AlGaInP-based semiconductor vertical micro LED chip can be manufactured by using a GaAs substrate as a substrate and forming first an AlAs layer as a sacrificing layer, growing AlGaInP-based semiconductor layers epitaxially on the AlAs layer and separating the GaAs substrate by carrying out wet etching with hydrofluoric acid-base etchant after steps of forming electrodes, device isolation and the like.

By dispersing the blue light emission vertical micro LED chips 510, the red light emission vertical micro LED chips 520 and the green light emission vertical micro LED chips 530 in a liquid, respectively, semiconductor chip inks can be prepared. Regarding a semiconductor chip ink ejection device, for example, three ink chambers are disposed adjacent to the inkjet print head 301 of the semiconductor chip ink ejection device 300 shown in FIG. 7, three kinds of semiconductor chip inks are filled up in the ink chambers, respectively, three ejection nozzles are formed in the inkjet print head which can eject three kinds of the semiconductor chip inks independently from each other and three kinds of semiconductor chip inks are ejected from each ejection nozzle by operating a piezoactuator.

According to the fourth embodiment, it is possible to mount vertical micro LED chips for light emission of each of RGB on the mounting substrate 400 easily, efficiently and in a very short time and to remove effects of inferior vertical micro LED chips easily, whereby a high performance passive driving system color micro LED display can be ralized in a low cost. Furthermore, a plurality of vertical micro LED chips are joined to the chip joining parts 421A, 421B, 421C, which correspond to light emitting areas of each of B, R and respectively. Therefore, even if the size of the vertical micro LED chip is small, brightness can be secured. And even if there exists difference of light emission wavelength among vertical micro LED chips, the wavelength is averaged as a whole, vertical micro LED chips having the wavelength within permissible range can be used, whereby manufacturing cost of the color micro LED display can be reduced. Similarly, even if there exists difference of light emission intensity among vertical micro LED chips, the light emission intensity is averaged as a whole. This also leads to reduction of manufacturing cost of the color micro LED display. When specification such as pixel size and the like is changed, it is possible to easily cope with it by increasing and decreasing the number of vertical micro LED chips joined to the chip joining parts 421A, 421B, 421C without changing the size of the vertical micro LED chip.

The Fifth Embodiment

Color Micro LED Display

In the fifth embodiment, an active matrix driving system color micro LED display is described.

Figure 24:
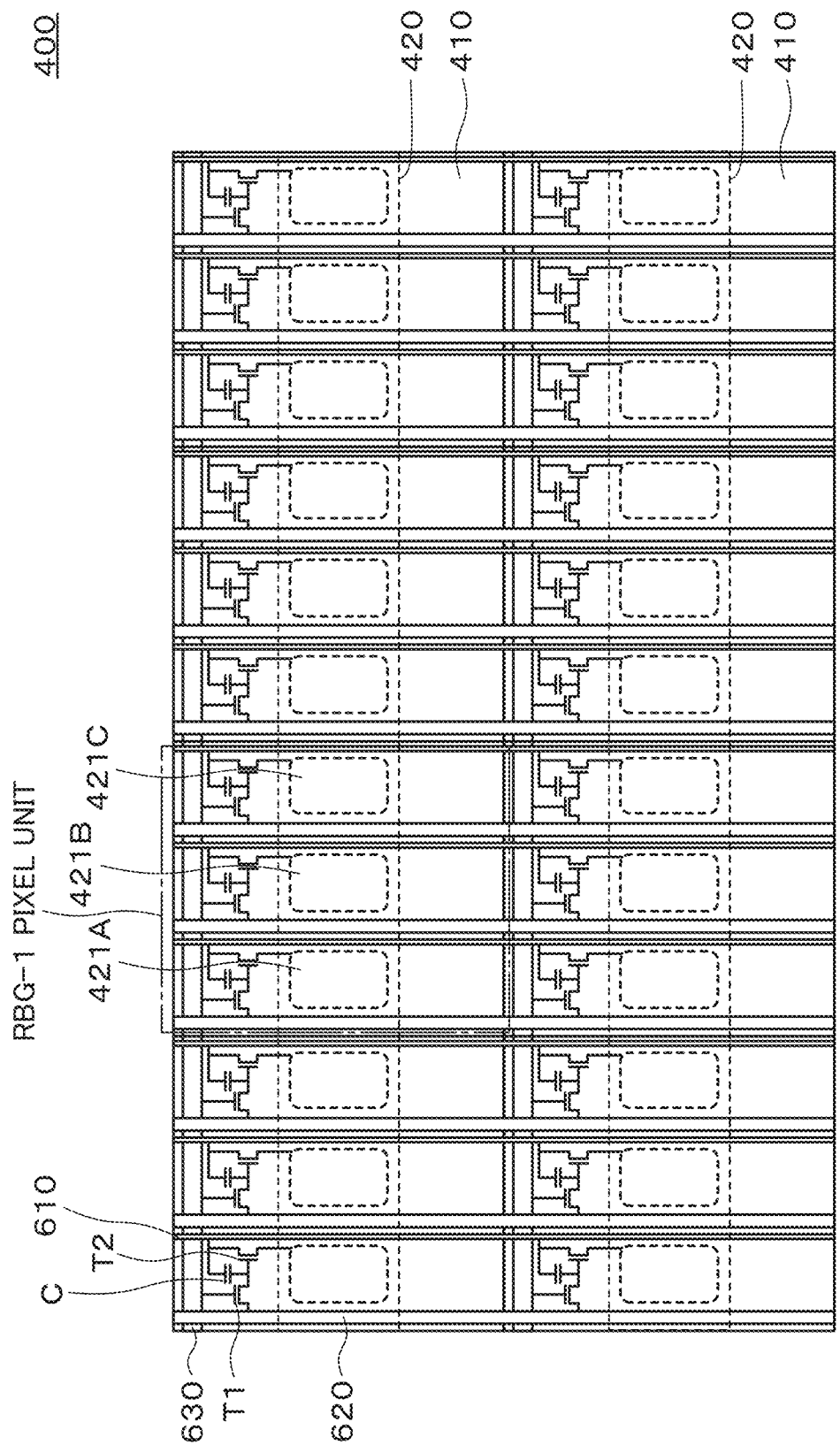
FIG. 24 A plan view showing a mounting substrate of an active driving system color micro LED display according to a fifth embodiment of the invention.

FIG. 24 shows lower electrode wiring lines on the mounting substrate 400 of the color micro LED display. The lower electrodes 420 of the lower electrode wiring line are formed parallel to each other in the row direction as the same as the fourth embodiment. RGB-1 pixel units, each of which is formed by arranging light emitting areas of each of RGB adjacently each other along each lower electrode 420 are arranged and as a whole of the mounting substrate 400 pixels are arranged in a two dimensional matrix. In each pixel, three chip joining parts 421A, 421B, 421C are formed on the lower electrode 420 and they correspond to, for example, light emitting areas of B, R, G, respectively. Formed also as the lower electrode wiring lines are power supplying lines 610 and data lines 620 which extend in the column direction and scanning lines 630 which extend in the row direction. An active driving circuit is formed between each data line 620 and each light emitting area of each pixel. Each light emitting area of each pixel is selected by the active driving circuit. The active driving circuit is configured by transistors T1, T2 and a condenser C. The transistors T1, T2 are generally configured by a thin film transistor which uses a semiconductor thin film such as a polycrystalline Si thin film and the like. The condenser C is configured by stacking a lower electrode, an insulating film and an upper electrode. Source, drain and gate of the transistor T1 are connected with the data line 620, gate of the transistor T2 and the scanning line 630, respectively. Source and drain of the transistor T2 are connected with the power supplying line 610 and the lower electrode 420. The condenser C is connected between drain of the transistor T1 and the power supplying line 610. Each light emitting area of each pixel is selected by selection of the scanning line 630 and the data line 620.

Figure 25:
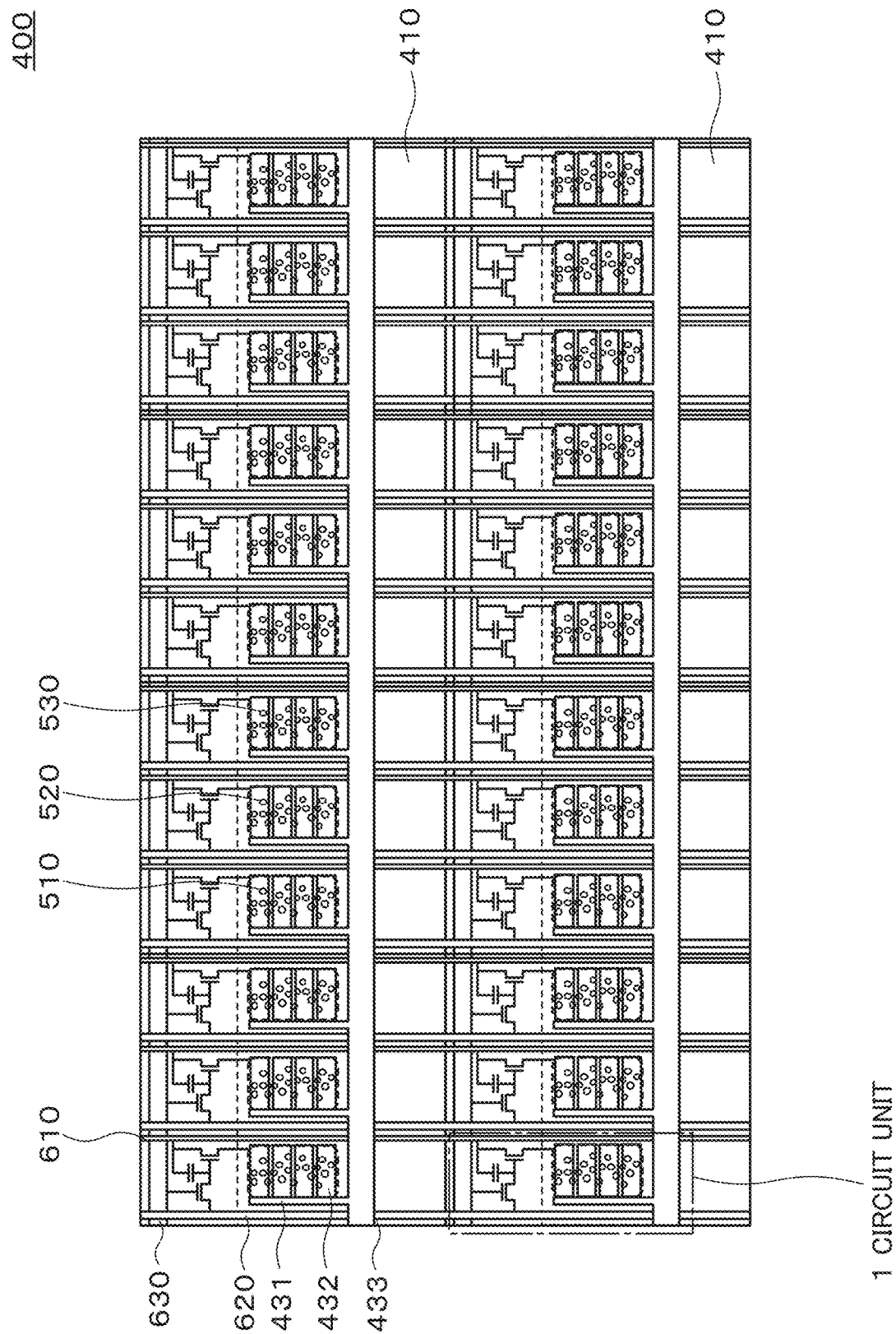
FIG. 25 A plan view showing the active driving system color micro LED display according to the fifth embodiment of the invention.

FIG. 25 shows the state where the blue light emission vertical micro LED chips 510, the red light emission vertical micro LED chips 520 and the green light emission vertical micro LED chips 530 are mounted on the mounting substrate 400 as the same as the fourth embodiment and the upper electrode 430 is formed. The upper electrode 430 has a common electrode part 433 which connects each upper electrode main line part 431. FIG. 25 shows 1 circuit unit. The number of vertical micro LED chips in 1 circuit unit is typically not less than 3.

The blue light emission vertical micro LED chip 510, the red light emission vertical micro LED chip 520 and the green light emission vertical micro LED chip 530 are the same as those used in the fourth embodiment. Three kinds of semiconductor chip inks and the semiconductor chip ink ejection device are the same as the fourth embodiment.

According to the fifth embodiment, it is possible to mount vertical micro LED chips for light emission of each of RGB on the mounting substrate 400 easily, efficiently and in a very short time and to remove effects of inferior vertical micro LED chips easily, whereby a high performance active driving system color micro LED display can be ralized in a low cost. Furthermore, the same advantages as the fouth embodiment can be obtained.

The Sixth Embodiment

Micro LED Integrated Device Manufacturing Method

Figure 26:
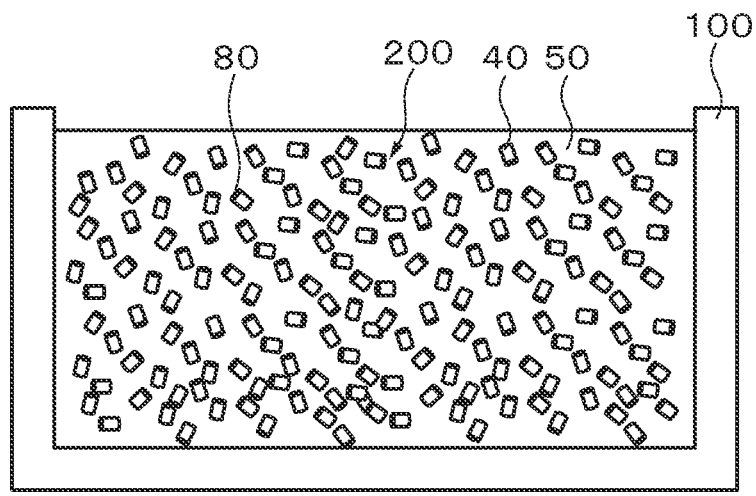
FIG. 26 A schematic view showing a semiconductor chip ink which is used in a micro LED integrated device manufacturing method according to a sixth embodiment of the invention.
Figure 27:
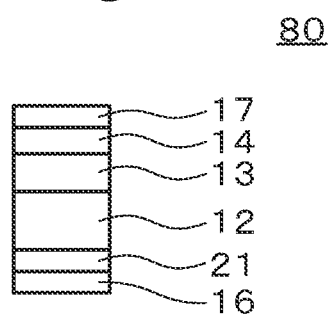
FIG. 27 A cross-sectional view showing a vertical micro LED chip, which is used instead of the Zener diode, contained in the semiconductor chip ink which is used in the micro LED integrated device manufacturing method according to the sixth embodiment of the invention.

In the sixth embodiment, as shown in FIG. 26, the semiconductor chip ink 200 is prepared by dispersing the vertical micro LED chips 40 and vertical micro LED chips 80 which are used instead of the Zener diodes 60 in the liquid 50 in the container 100. FIG. 27 shows the vertical micro LED chip 80. As shown in FIG. 27, the vertical micro LED chip 80 has a structure in which the Sn film 16, the n-side electrode 21, the $n^+$-type GaN layer 12, the light emitting layer 13, the p-type GaN layer 14 and the p-side electrode 17 are stacked in order. In this case, the n-side electrode 21 contains Ni films and therefore the vertical micro LED chip 80 is configured such that the n-side electrode 21 side is more strongly attracted to a magnetic field than the p-side electrode 17 side. The vertical micro LED chip 80 is not used as a light emitting device and therefore it is not necessary to extract a light from the above. Therefore, the top layer p-side electrode 17 is formed on the whole surface. More specifically, the p-side electrode 17 is made of, for example, a Ti/ITO/Ti/Au layered film and the n-side electrode 21 is made of, for example, a Ti/Al/Ni/Au layered film. The vertical micro LED chip 80 has the same stacking structure of the $n^+$-type GaN layer 12, the light emitting layer 13 and the p-type GaN layer 14 as the vertical micro LED chip 40. The vertical micro LED chip 80 differs from the vertical micro LED chip 40 only in that the n-side electrode 21 is a full-surface electrode and the Sn film 16 is formed on the n-side electrode 21, not on the p-side electrode 17. Therefore, size (size in the lateral direction), height, weight and the like of the vertical micro LED chip 80 are easy to adjust to those of the vertical micro LED chip 40. Therefore, it is possible to manufacture the vertical micro LED chip 80 by almost similar processes using similar semiconductor materials as the vertical micro LED chip 40. The semiconductor chip ink 200 may contain Ag nanoparticles, fillers, surfactants and the like in addition to the vertical micro LED chips 40 and the vertical micro LED chips 80, as necessary. The vertical micro LED chips 80 are added at a ratio not larger than a tenth of the vertical micro LED chips 40.

The semiconductor chip ink 200 is ejected to the chip joining part 421 of the lower electrode 420 of the mounting substrate 400 as the same as the first embodiment. Thereafter, as the same as the first embodiment, a magnetic field is applied by the magnetic field applying device 311 to magnetize the Ni films contained in the p-side electrode 17 of the vertical micro LED chips 40 contained in the semiconductor chip ink 200. And the vertical micro LED chips 40 are made contact with the chip joining part 421 such that the p-side electrode 17 side faces downward. At the same time, the magnetic field is also applied to magnetize the Ni films contained in the n-side electrode 21 of the vertical micro LED chips 80 contained in the semiconductor chip ink 200. And the vertical micro LED chip 80 are made contact with the chip joining part 421 such that the n-side electrode 21 side faces downwardly. Thereafter, as the same as the first embodiment, the semiconductor chip ink 200 ejected to the chip joining part 421 is dried and further the Sn film 16 of each vertical micro LED chip 40 and the Sn film 16 of each vertical micro LED chip 80 are made to melt and solidify, whereby the vertical micro LED chips 40 and the vertical micro LED chips 80 are joined electrically and mechanically to the chip joining part 421. Thereafter, processes are carried out as the same as the first embodiment to manufacture the micro LED integrated device. The plan view of the micro LED integrated device is similar to FIG. 13. In this case, the vertical micro LED chips 40 are connected forwardly between the lower electrode 420 and the upper electrode 430, whereas the vertical micro LED chips 80 are reversely connected between them. In other words, the vertical micro LED chips 80 are reversely biased.

Micro LED Integrated Device

Figure 28:
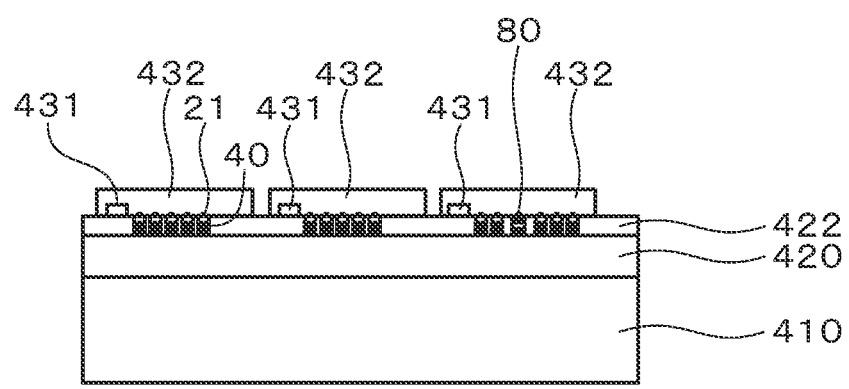
FIG. 28 A cross-sectional view showing the micro LED integrated device manufacturing method according to the sixth embodiment of the invention.

As shown in FIG. 28, the micro LED integrated device has the same structure as the micro LED integrated device according to the first embodiment except that the vertical micro LED chips 40 are connected between the lower electrode 420 and the lower electrode 430, whereas the vertical micro LED chips 80 are reversely connected between them.

According to the sixth embodiment, another advantage can be obtained in addition to the same advantages as the first embodiment. That is, the vertical micro LED chips 80 are connected between the lower electrode 420 and the upper electrode 430 such that a reverse bias is applied. Therefore, when surge voltage and the like are applied between the lower electrode 420 and the upper electrode 430, current can flow through the vertical micro LED chips 80. As a result, it is possible to prevent the micro LED integrated device from breaking.

The Seventh Embodiment

Micro LED Integrated Device Manufacturing Method

Figure 29:
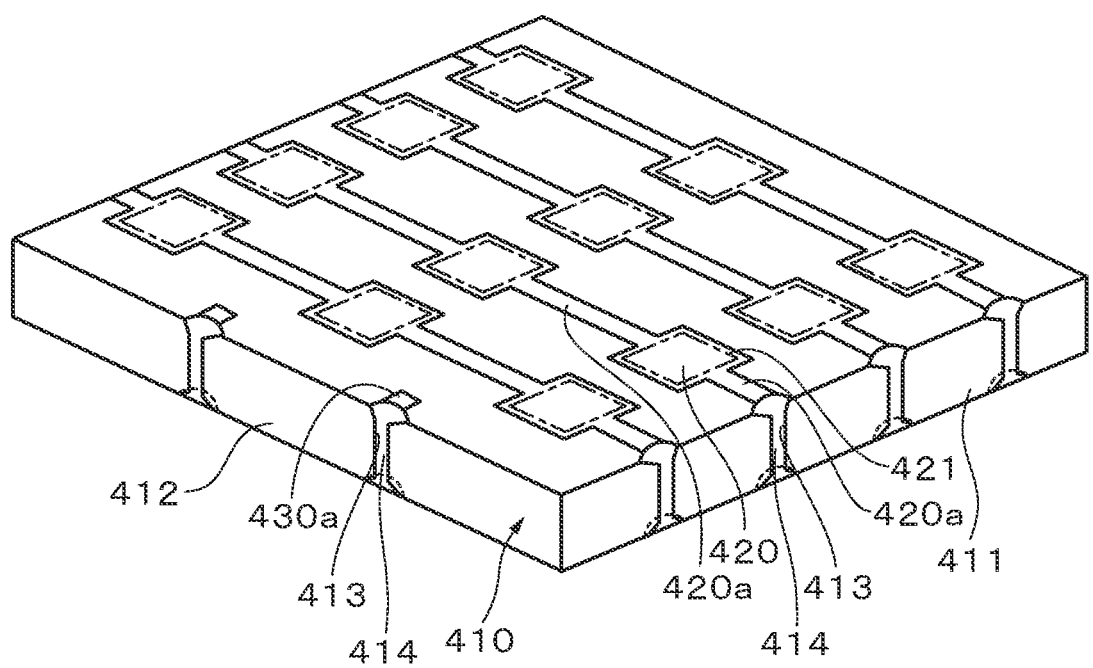
FIG. 29 A perspective view showing a mounting substrate which is used in a micro LED integrated device manufacturing method according to a seventh embodiment of the invention.

The micro LED integrated device manufacturing method according to the seventh embodiment differs from the micro LED integrated device manufacturing method according the first embodiment in that the mounting substrate 400 shown in FIG. 29 is used. Others of the micro LED integrated device manufacturing method are the same as the micro LED integrated device manufacturing method according to the first embodiment.

As shown in FIG. 29, the mounting substrate 400 having a square or rectangular shape has a pair of side faces 411 facing each other (only one side face is shown) and another pair of side faces 412 facing each other (only one side face is shown) which lie at a right angle to the side faces 411. A plurality of line-like grooves 413 are formed on the side faces 411, 412 and side face electrodes 414 are formed in the grooves 413 such that they elongate between the upper surface and the lower surface of the substrate 410. The substrate 410 may be rigid or flexible and transparent or opaque and may be selected as necessary. The substrate 410 may be, for example, Si substrate, glass substrate, glassepoxy substrate and the like, or resin film and the like. The upper end part and the lower end part of the grooves 413 have a wide shape obtained by cutting off the corner part between the side faces 411, 412 and the both major surfaces and therefore the upper end part and the lower end part of the side face electrodes 414 has a shape spreading over the cut off part. The side face electrodes 414 on the side face 411 are formed at intervals as the same as the lower electrodes 420 which are described later. The side face electrodes 414 on the side face 412 are formed at intervals as the same as the upper electrodes 430 which are described later. A plurality of lower electrodes 420 are formed on one major surface of the substrate 410 in the direction pararell to the side faces 412 corresponding to each side face electrode 414 via a wiring line part 430*a* in line. A chip joining part 421 is formed on each lower electrode 420. The end wiring line part 430*a* is connected with the side face electrodes 414. The side face electrodes 414 on the side face 412 are connected with the wiring line part 430*a* for the upper electrode 430 formed on one major surface of the substrate 410.

Figure 30:
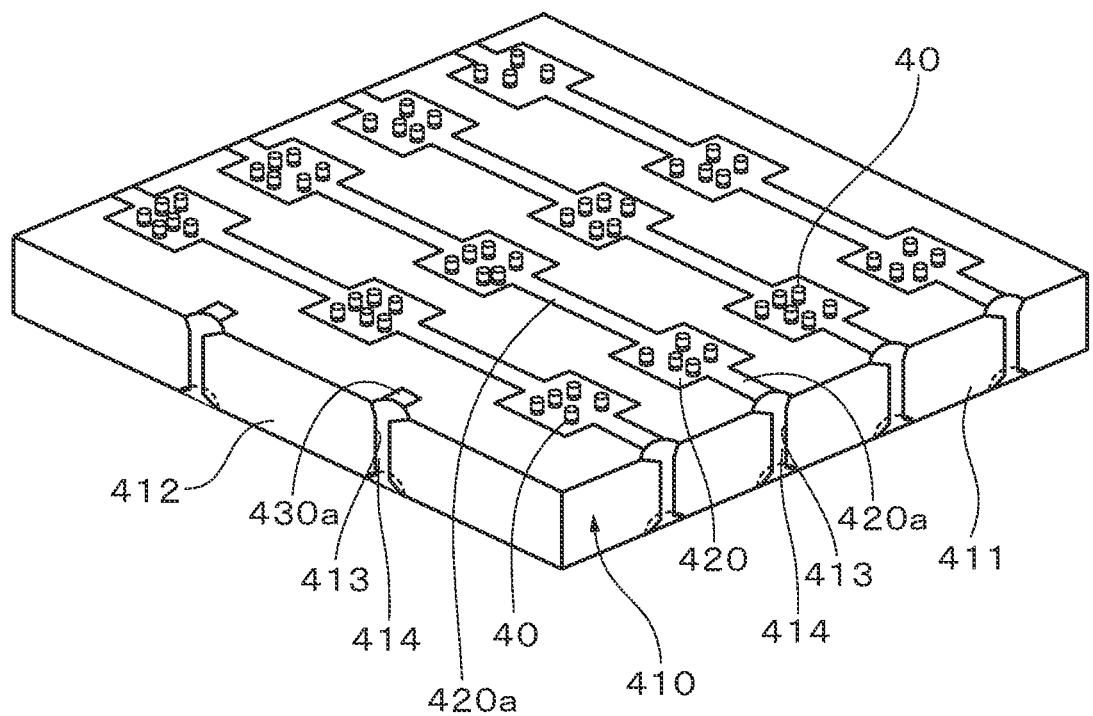
FIG. 30 A perspective view showing the state where the vertical micro LED chips are joined to the chip joining parts of the mounting substrate in the micro LED integrated device manufacturing method according to the seventh embodiment of the invention.

As shown in FIG. 30, the p-side electrodes 17 of the vertical micro LED chips 40 are joined electrically and mechanically to each of the chip joining parts 421 on the lower electrodes 420 as the same as the first embodiment. As shown in FIG. 30, in each of the chip joining parts 421, the vertical micro LED chips 40 are randomly arranged.

Figure 31:
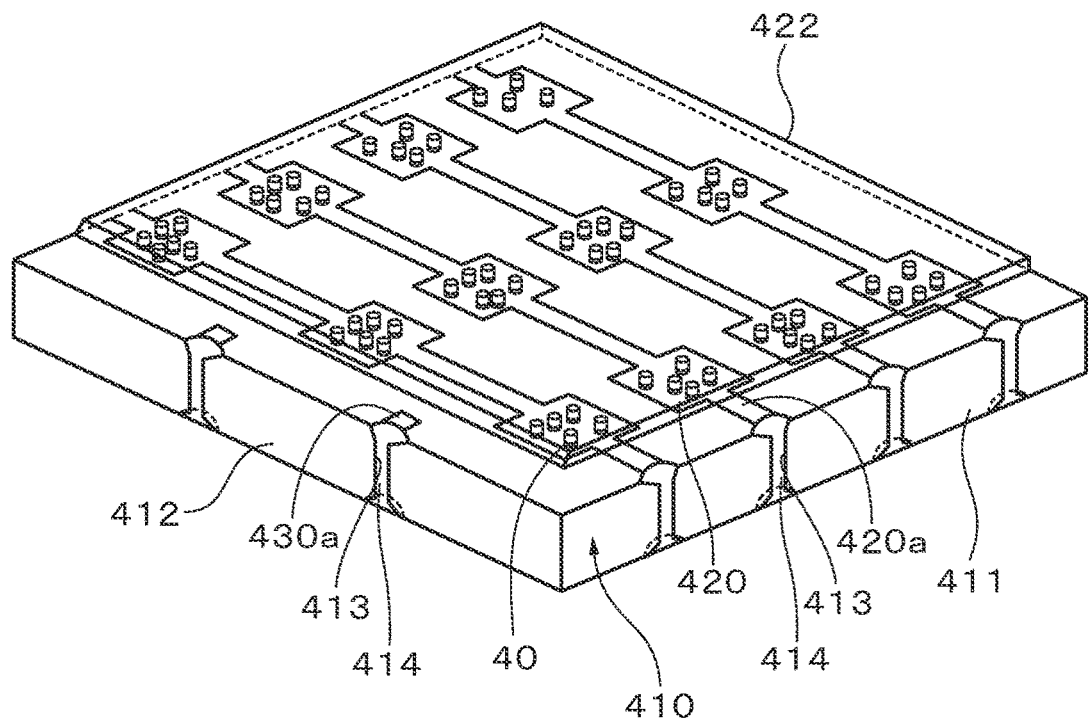
FIG. 31 A perspective view showing the state where an insulating film is formed to cover the vertical micro LED chips joined to the chip joining parts of the mounting substrate in the micro LED integrated device manufacturing method according to the seventh embodiment of the invention.

Then, as shown in FIG. 31, after the insulating film 422 is formed on the whole surface of the mounting substrate 400 in which the vertical micro LED chips 40 are joined to the chip joining parts 421 such that the surface of the insulating film 422 is almost flat, the insulating film 422 is etched by the RIE method and the like to expose the n-side electrodes 21.

Figure 32:
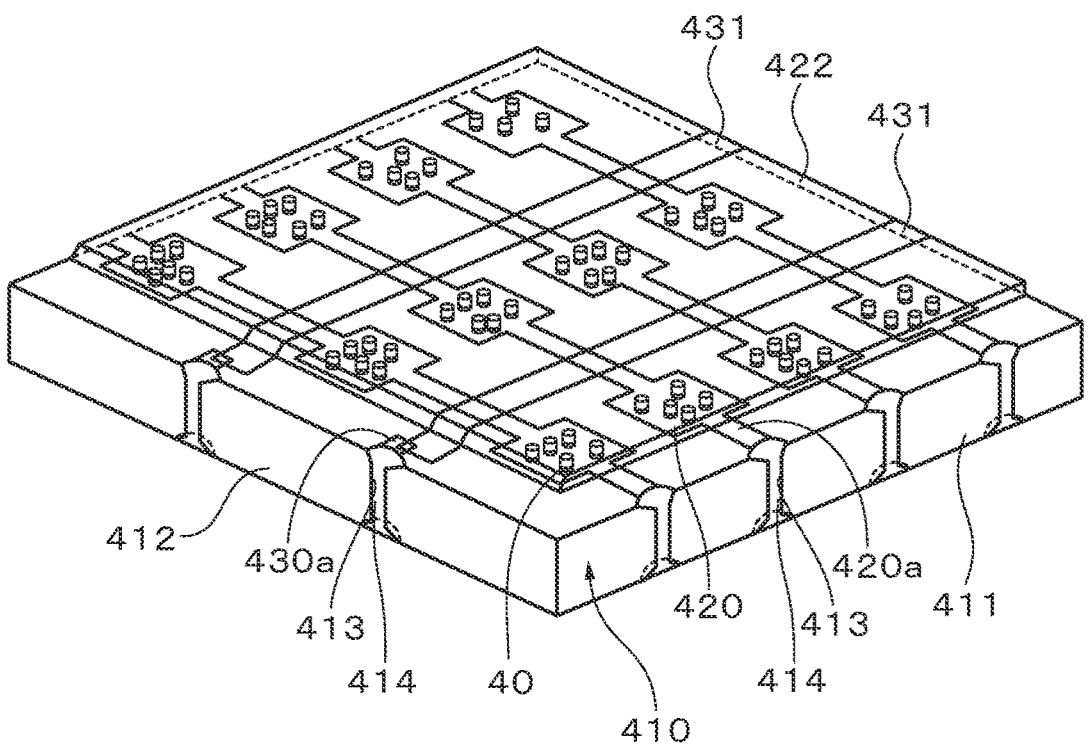
FIG. 32 A perspective view showing the state where an upper electrode main line part is formed on the insulating film covering the vertical micro LED chips joined to the chip joining parts of the mounting substrate in the micro LED integrated device manufacturing method according to the seventh embodiment of the invention.

Then, as shown in FIG. 32, formed on the insulating film 422 is a plurality of upper electrode main line parts 431 which elongate parallel to each other in the direction at a right angle to the lower electrodes 420.

Figure 33:
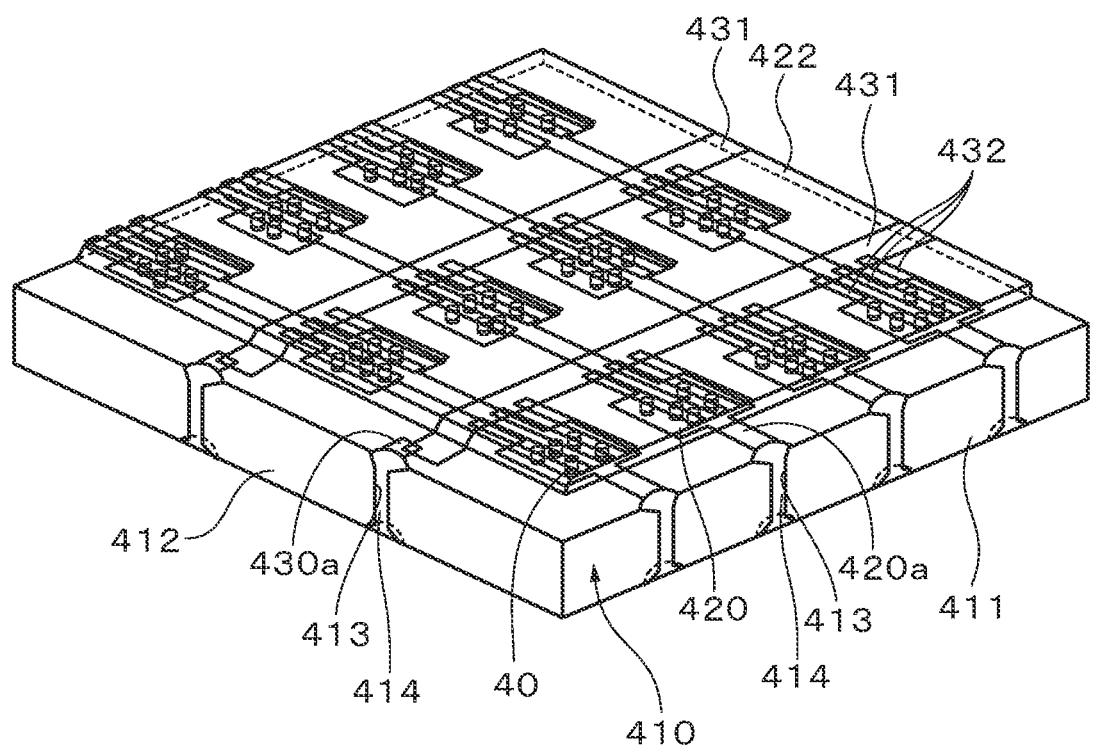
FIG. 33 A perspective view showing the state where transparent electrodes connected with the upper electrode main line part are formed on the insulating film covering the vertical micro LED chips joined to the chip joining parts of the mounting substrate in the micro LED integrated device manufacturing method according to the seventh embodiment of the invention.

Then, as shown in FIG. 33, formed on the insulating film 422 parallel to each other are a plurality of transparent electrodes 432 for each of the chip joining parts 421 which connects the n-side electrode 21 of the vertical micro LED chip 40 and the upper electrode main line part 431 (in this example, the number of transparent electrodes 432 is 3) so as to extend over the vertical micro LED chips 40 which are randomly arranged on each of the chip joining parts 421. The transparent electrodes 432 are formed such that they cover almost the whole, for example less than 80% of each of the chip joining parts 421. The transparent electrode 432 forms an upper electrode branch line part and the upper electrode main line part 431 and the transparent electrode 432 form an upper electrode 430. Among the transparent electrodes 432, there may be the transparent electrode 432, a part of which is made contact with the n-side electrode 21, or there may be the transparent electrode 432 which is not made contact with the n-side electrode 21. However, a part of at least one transparent electrode 432 is made contact with the n-side electrode 21 of at least one, typically a plurality of vertical micro LED chips 40. The light emitting area of one vertical micro LED chip 40 is typically selected to be not larger than a thousandth of the area covered by one circuit unit.

Thereafter, as the same as the first embodiment, a test of the micro LED integrated device is carried out and as necessary, the micro LED integrated device is repaired.

Structure of the Micro LED Integrated Device

As shown in FIG. 33, the micro LED integrated device has the mounting substrate 400 having the lower electrodes 420 on one major surface, the chip joining parts 421 formed on the lower electrode 420, a plurality of vertical micro LED chip 40, each of which has the n-side electrode 21 and the p-side electrode 17 on the upper surface and the lower surface and is configured such that the p-side electrode 17 side is more strongly attracted to a magnetic field than the n-side electrode 21 side, which are joined to the chip joining part 421 in random arrangement, and the upper electrode 430 as the upper layer of the vertical micro LED chips 40 having the upper electrode main line part 431 and a plurality of branch line parts, that is, the transparent electrodes 432 which are branched from the upper electrode main line part 431 so as to straddle the chip joining part 421. And, the vertical micro LED chips 40 are joined to the chip joining part 421 such that the p-side electrode 17 side faces the chip joining part 421. The n-side electrode 21 and the upper electrode 430 are electrically connected with each other. The n-side electrode 21 of at least one vertical micro LED chip 40 and the transparent electrodes 432 of the upper electrode 430 are electrically connected with each other.

According to the seventh embodiment, other advantages can be obtained in addition to the same advantages as the first embodiment. That is, since the mounting substrate 400 has the lower electrodes 420 on one major surface and a plurality of side face electrodes 414 elongating between the upper surface and the lower surface on the side faces and the wiring line part 420a of the lower electrode 420 and at least one side face electrode 414 are electrically connected with each other, for example, it is possible to easily realize a semiconductor chip integrated device assembly by mounting a plurality of semiconductor chip integrated devices on one major surface of a cuicuit board adjacent to each other. Therefore, for example, when the semiconductor chip integrated device is a light emitting diode display panel, a plurality of light emitting diode display panels can be connected without remarkable panel junctions. As a result, a large-sized excellent light emitting diode display panel can be easily realized.

The Eighth Embodiment

Micro LED Integrated Device Assembly

In the eighth embodiment, the micro LED integrated device assembly is described.

Figure 34:
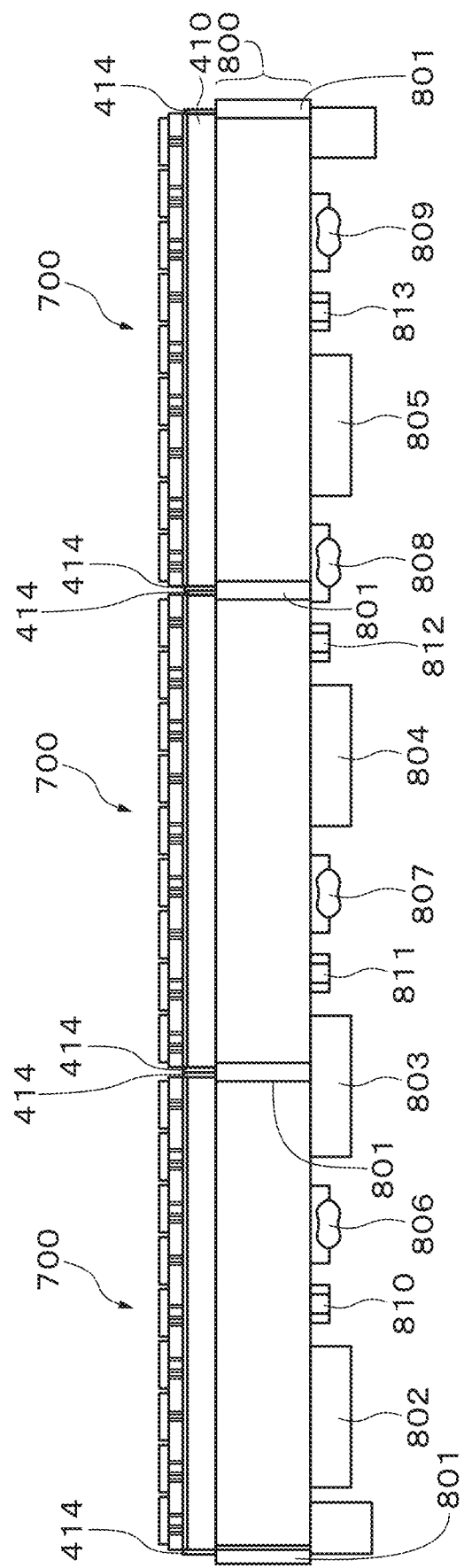
FIG. 34 A cross-sectional view showing a micro LED integrated device assembly according to an eighth embodiment of the invention.

FIG. 34 shows the micro LED integrated device assembly. As shown in FIG. 34, in the micro LED integrated device assembly, a plurality of micro LED integrated devices 700 according to the seventh embodiment are mounted on one major surface of a circuit board 800 adjacent to each other, more specifically close to each other. In this case, the side face electrodes 414 formed in the positions facing each other of the mounting substrates 400 of a pair of micro LED integrated devices 700 adjacent to each other are made contact with each other and electrically connected. A control circuit of the micro LED integrated device assembly is formed on the circuit board 800. The circuit board 800 is, for example, a printed circuit board (PCB) and the like. In the circuit board 800, through-hole electrodes 801 are formed in positions corresponding to the side face electrodes 414 of the mounting substrate 400 of each of the micro LED integrated devices 700. Parts and devices forming the control circuit are mounted on the other main surface of the circuit board 800. In FIG. 34, as an example, ICs 802~805, resistors 806~809 and inductors 810~813 are shown. In FIG. 34, the IC 803 is connected with the through-hole electrode 801 and one end of the resistor 806 is connected with the through-hole electrode 801.

According to the eighth embodiment, since the mounting substrate 400 of the micro LED integrated device 700 has the side face electrodes 414, it is possible to easily realize a semiconductor chip integrated device assembly in which a plurality of semiconductor chip integrated devices 700 are mounted on the circuit board 800 close to each other in all directions. According to the semiconductor chip integrated device assembly, by usig a micro LED display panel as the micro LED integrated device 700, a large screen micro LED display panel having the area of (the area of one micro LED display panel)×(the number of mounting). According to the micro LED display panel, it is possible to connect the micro LED display panel corresponding to each micro LED integrated device 700 such that the side face electrodes 414 of the mounting substrate 400 are made contact with each other and close to each other. Therefore, when the pixel size becomes size of hundreds μm, panel junctions are not remarkable.

Heretofore, embodiments of the present invention have been explained specifically. However, the present invention is not limited to these embodiments, but contemplates various changes and modifications based on the technical idea of the present invention.

For example, numerical numbers, structures, shapes, materials, methods and the like presented in the aforementioned embodiments are only examples, and the different numerical numbers, structures, shapes, materials, methods and the like may be used as necessary.

For example, in the fourth embodiment, the semiconductor chip ink in which the blue light emission vertical micro LED chips 510 are dispersed, the semiconductor chip ink in which the red light emission vertical micro LED chips 520 are dispersed and the semiconductor chip ink in which the green light emission vertical micro LED chips 530 are dispersed are ejected at the same time from three ejection nozzles. However, each of these semiconductor chip inks may be ejected independently.

Although not illustrated as embodiments, RGB light emission may be realized by joining, for example, a plurality of blue light emission vertical micro LED chips 510 to all of the chip joining parts 421A, 421B, 421C in random arrangement and arranging red phosphor and green phosphor over the chip joining parts 421B, 421C, respectively after formation of the upper electrode, test and repair. RGB light emission may also be realized by joining, for example, a plurality of near ultraviolet light emission vertical micro LED chips to all of the chip joining parts 421A, 421B, 421C in random arrangement and arranging blue phosphor, red phosphor and green phosphor over the chip joining parts 421A, 421B, 421C, respectively after formation of the upper electrode, test and repair. Furthermore, RGB light emission may be realized by joining, for example, a plurality of blue light emission vertical micro LED chips 510 to the chip joining parts 421A, 421B in random arrangement and a plurality of green light emission vertical micro LED chips 530 to the chip joining part 421C in random arrangement and arranging red phosphor over the chip joining part 421B after formation of the upper electrode, test and repair.

EXPLANATION OF REFERENCE NUMERALS

10 sapphire substrate
11 n-type GaN layer
12 n$^+$-type GaN layer
13 light emitting layer
14 p-type GaN layer
16 Sn film
17 p-side electrode
18 covering materials
19 supporting substrate
21 n-side electrode
40 vertical micro LED chip
200 semiconductor chip ink
300 semiconductor chip ink ejection device
311~313 magnetic field applying device
400 mounting substrate
410 substrate
420 lower electrode
421 chip joining part
430 upper electrode
431 upper electrode main line part
432 transparent electrode

The invention claimed is:

1. A micro LED display, comprising:
a mounting substrate having a lower electrode on one major surface,
a chip joining part formed by a part of an upper surface of the lower electrode or a bump formed on a part of the upper surface of the lower electrode in respective light emitting areas of respective pixels composing a micro LED display,
a plurality of micro LED chips joined to the chip joining part in random arrangement, each of the micro LED chips has a first electrode and a second electrode on an upper surface and a lower surface of the micro LED chip, respectively, and is configured such that the second electrode is more strongly attracted to a magnetic field than the first electrode, the second electrode containing ferromagnetic materials and the ferromagnetic materials being soft magnetic materials having properties that the soft magnetic materials are strongly magnetized by effect of a magnetic field and the soft magnetic materials have no magnetic force when a magnetic field does not exist,
wherein the first electrode is a p-side electrode and the second electrode is an n-side electrode or the first electrode is a n-side electrode and the second electrode is an p-side electrode; and
an upper electrode over the plurality of the micro LED chips having a main line part and a plurality of branch line parts branched from the main line part so as to straddle the chip joining part,
each of the plurality of the micro LED chips being joined to the chip joining part such that the second electrode faces and is electrically connected to the chip joining part, and the first electrode faces and is electrically connected to one of the plurality of the branch line parts of the upper electrode, and
wherein the micro LED display further comprises Zener diodes, each of the Zener diodes has a p-side electrode and an n-side electrode on the upper surface and the lower surface of the Zener diode, respectively, and is configured such that one of the p-side electrode side and the n-side electrode side is more strongly attracted to a magnetic field than the other, and the Zener diodes are connected so as to be reversely biased for the micro LED chips.

2. The micro LED display according to claim 1 wherein each of the micro LED chips has a chip size not larger than 10 µm×10 µm and a thickness not larger than 10 µm.

3. The micro LED display according to claim 1 wherein the branch line parts cover more than 80% of the area of the chip joining part.

4. The micro LED display according to claim 1 wherein the branch line parts are formed parallel to each other and perpendicular to the main line part, the width of each branch line part of the branch line parts is 5~100 µm, the width of an opening between the branch line parts is 1~5 µm and the number of the branch line parts is 3~10.

5. A method for manufacturing a micro LED display, comprising steps of:
providing a mounting substrate having a lower electrode on one major surface, providing a chip joining part formed by a part of an upper surface of the lower electrode or a bump formed on a part of the upper surface of the lower electrode in respective light emitting areas of respective pixels composing a micro LED display, providing a supplying a liquid droplet like semiconductor chip ink containing a liquid and a plurality of micro LED chips, wherein each of the micro LED chips has a first electrode and a second electrode on the upper surface and the lower surface of the micro LED chip, respectively, and is configured such that the second electrode side is more strongly attracted to a magnetic field applied to the chip joining part than the first electrode side, the second electrode containing ferromagnetic materials and the ferromagnetic materials being soft magnetic materials having properties that the soft magnetic materials are strongly magnetized by effect of a the magnetic field and the soft magnetic materials have no magnetic force when a the magnetic field does not exist to a chip joining part formed by a part of the an upper surface of a lower electrode of a mounting substrate having the lower electrode on one major surface or a bump formed on a part of the upper surface of the lower electrode in respective light emitting areas of respective pixels comprising a micro LED display, supplying a liquid-droplet-like of the semiconductor chip ink to the chip joining part, applying a the magnetic field from the a side opposite to the chip joining part with respect to the mounting substrate to magnetize the soft magnetic materials of the micro LED chips, joining the micro LED chips to the chip joining part in random arrangement by attracting the micro LED chips in the semiconductor chip ink by a magnetic force produced by the magnetic field such that the second electrode side faces the chip joining part, and electrically connecting the second electrode and the lower electrode with each other, forming an upper electrode as the upper layer of over the plurality of the micro LED chips having a main line part and a plurality of branch line parts branched from the main lane part so as to straddle the chip joining part such that the first electrode of at least one micro LED chip and the branch line parts of the upper electrode are electrically connected with each other;

and applying a voltage between the upper electrode and the lower electrode to make current flow through each micro LED chip after the upper electrode is formed, carrying out an image analysis of emission of light of each micro LED chip to find the branch line part to which inferior micro LED chips are connected and separating the inferior micro LED chips by cutting the branch line part.

6. The method for manufacturing a micro LED display according to claim 5 wherein the branch line parts are formed parallel to each other and perpendicular to the main line part, the width of each branch line part of the branch line parts is 5~100 μm, the width of an opening between the branch line parts is 1~5 μm and the number of the branch line parts is 3~10.

7. The method for manufacturing a micro LED display according to claim 5 wherein each of the micro LED chips has a chip size not larger than 10 μm×10 μm and a thickness not larger than 10 μm.

8. The method for manufacturing a micro LED display according to claim 5 wherein the magnetic field application is carried out before the semiconductor chip ink is supplied, or when the semiconductor chip ink is supplied, or during the period from the time point that the semiconductor chip ink is supplied to the time point that the liquid of the semiconductor chip ink evaporates.

9. The method for manufacturing a micro LED display according to claim 5 wherein the semiconductor chip ink is ejected to the chip joining part from the tip of a nozzle by an inkjet printing method.

* * * * *